United States Patent
Nakasuji et al.

(10) Patent No.: US 9,082,685 B2
(45) Date of Patent: Jul. 14, 2015

(54) OPTICAL-COUPLING SEMICONDUCTOR DEVICE

(71) Applicant: PANASONIC CORPORATION, Osaka (JP)

(72) Inventors: Takeshi Nakasuji, Osaka (JP); Yuichi Niimura, Osaka (JP); Hideo Nishikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/306,927

(22) Filed: Jun. 17, 2014

(65) Prior Publication Data

US 2014/0374776 A1  Dec. 25, 2014

(30) Foreign Application Priority Data

Jun. 25, 2013  (JP) .................. 2013-133078
Nov. 26, 2013  (JP) .................. 2013-244209
Nov. 26, 2013  (JP) .................. 2013-244210

(51) Int. Cl.
H01L 25/16 (2006.01)
H01L 23/00 (2006.01)

(52) U.S. Cl.
CPC .............. *H01L 25/167* (2013.01); *H01L 24/48* (2013.01); *H01L 2224/32245* (2013.01); *H01L 2224/48247* (2013.01); *H01L 2224/48465* (2013.01); *H01L 2224/73265* (2013.01); *H01L 2924/13091* (2013.01)

(58) Field of Classification Search
USPC .......................................... 257/82
See application file for complete search history.

(56) References Cited

U.S. PATENT DOCUMENTS

| | | | | |
|---|---|---|---|---|
| 8,361,392 | B2 * | 1/2013 | Lee et al. | 422/82.05 |
| 2003/0183893 | A1 * | 10/2003 | Li | 257/432 |
| 2010/0044723 | A1 * | 2/2010 | Yamamoto | 257/82 |

FOREIGN PATENT DOCUMENTS

JP      06-045636 A    2/1994

* cited by examiner

*Primary Examiner* — Thao P Le
(74) *Attorney, Agent, or Firm* — McDermott Will & Emery LLP

(57) ABSTRACT

The optical-coupling semiconductor device includes: a primary support plate and a secondary support plate facing each other and spaced apart a predetermined distance; a light emitting device situated on the primary support plate; and a light receiving device including a light receiving surface to receive light from a light emitting surface of the light emitting device. The light emitting device is situated on a surface facing the secondary support plate of the primary support plate so that the light emitting surface is oriented toward the secondary support plate. The light receiving device is situated on a surface facing the primary support plate of the secondary support plate so that the light receiving surface faces the light emitting surface of the light emitting device. The light emitting device is on the light receiving surface of the light receiving device.

19 Claims, 12 Drawing Sheets

FIG. 11 A
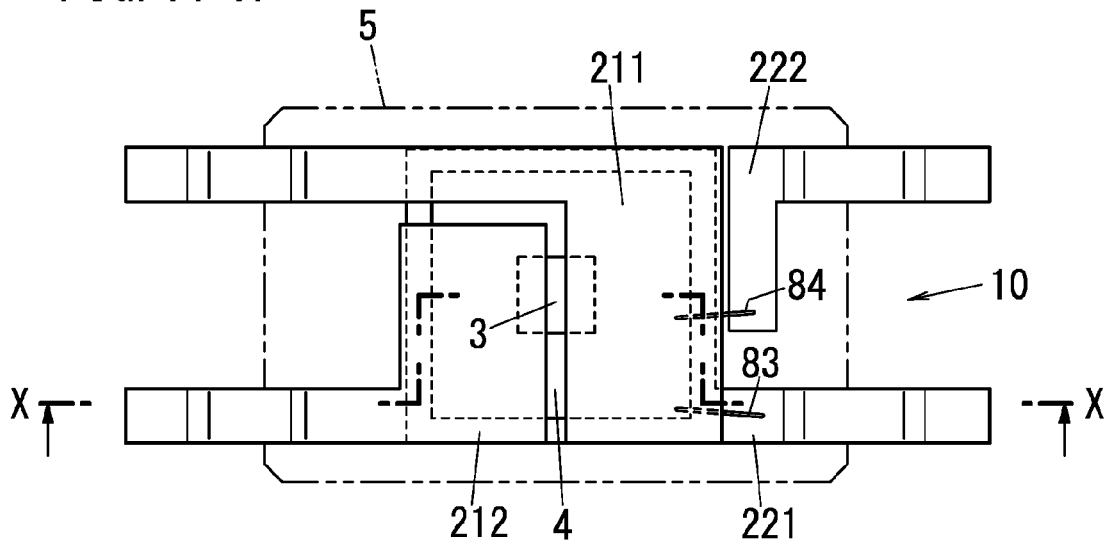
FIG. 11 B
FIG. 12
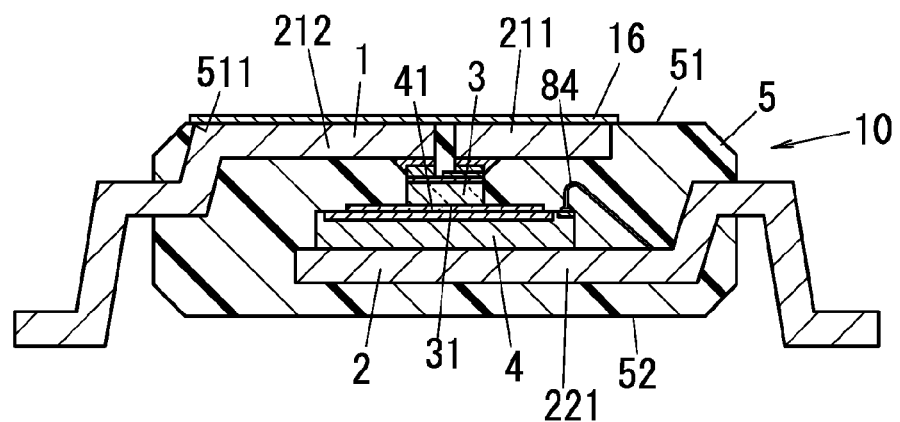

OPTICAL-COUPLING SEMICONDUCTOR DEVICE

CROSS-REFERENCE TO RELATED APPLICATIONS

The application is based upon and claims the benefit of priorities from Japanese Patent Application No. 2013-133078, filed on Jun. 25, 2013, Japanese Patent Application No. 2013-244209, filed on Nov. 26, 2013, and Japanese Patent Application No. 2013-244210, filed on Nov. 26, 2013, the entire contents of which are incorporated herein by reference.

TECHNICAL FIELD

The present invention generally relates to optical-coupling semiconductor devices and particularly relates to an optical-coupling semiconductor device including a light emitting device and a light receiving device that are optically coupled.

BACKGROUND ART

In the past, there have been optical-coupling semiconductor devices, and they have been used in various types of fields. Such an optical-coupling semiconductor device includes a light emitting device to convert an inputted electric signal into light, and a light receiving device to receive light from the light emitting device and covert the received light into an electric signal. This optical-coupling semiconductor device can transmit signals while keeping electrically insulating a primary circuit electrically connected to the light emitting device and a secondary circuit electrically connected to the light receiving device from each other.

Such a type of optical-coupling semiconductor device has been exemplified by a light receiving and emitting device in which a light receiving chip serving as a light receiving device and a light emitting chip serving as a light emitting device are stacked in a thickness direction while a transparent insulator layer is interposed between the chips (see document 1: JP 6-45636 A).

In the light receiving and emitting device of document 1, the light receiving chip is placed inside a recess formed in an insulating casing substrate. In the light receiving and emitting device, internal electrodes, wirings, and rear electrodes are arranged from the recess to a rear surface of the insulating casing substrate. The light receiving chip is bonded to one of the internal electrodes by die-bonding, and is connected to another of the internal electrodes via a bonding wire, and the light emitting device is connected to others of the internal electrodes via bonding wires. The recess is filled with a light transmissive resin to protect the light receiving device and the light emitting device, and an opaque resin covers an entire upper surface of the light transmissive resin.

The light receiving and emitting device of document 1 has a structure in which the light receiving chip and the light emitting chip are stacked on the same insulating substrate and are integrated, and a transparent insulating layer is interposed between the light receiving chip and the light emitting chip. Document 1 discloses the advantageous effect of this structure that light transmission efficiency is improved with a decrease in an interval between the light receiving chip and the light emitting chip.

Generally, light emitting devices generate heat while being in operation. If the optical-coupling semiconductor device fails to efficiently dissipate heat generated by the light emitting device, the light emission efficiency of the light emitting device is likely to decrease and the reliability of light transfer is also likely to decrease.

There have been demanded optical-coupling semiconductor device with the higher reliability of light transfer. The structure of the light receiving and emitting device of document 1 is insufficient to fulfill such demands, and thus further improvement is demanded.

SUMMARY

In view of the above insufficiency, the present invention has aimed to propose an optical-coupling semiconductor device having the more improved reliability of light transfer.

The optical-coupling semiconductor device of the first aspect in accordance with the present invention includes: a primary support plate and a secondary support plate; a light emitting device; and a light receiving device. The primary support plate and the secondary support plate face each other and are spaced apart a predetermined distance. The light emitting device is situated on a surface facing the secondary support plate of the primary support plate so that a light emitting surface of the light emitting device is oriented toward the secondary support plate. The light receiving device is situated on a surface facing the primary support plate of the secondary support plate so that a light receiving surface of the light receiving device faces the light emitting surface so as to receive light from the light emitting surface. The light emitting device is on the light receiving surface of the light receiving device.

Owing to this configuration, the optical-coupling semiconductor device can have the more improved reliability of light transfer.

According to the optical-coupling semiconductor device of the second aspect, in addition to the first aspect, the light emitting device is on the light receiving surface of the light receiving device while an optical-coupling member having light transmissive properties is interposed between the light emitting device and the light receiving surface.

According to the optical-coupling semiconductor device of the third aspect in accordance with the present invention, in addition to the second aspect, the light emitting device includes a light transmissive insulating substrate which allows passage of light emitted from the light emitting device. The light transmissive insulating substrate has electrically insulating properties. The light transmissive insulating substrate includes a surface defining the light emitting surface. The optical-coupling member has electrically insulating properties and is interposed between the light transmissive insulating substrate and the light receiving surface of the light receiving device.

According to the optical-coupling semiconductor device of the fourth aspect in accordance with the present invention, in addition to the second or third aspect, the optical-coupling member is surrounded by a light reflective member that reflects light emitted from the light emitting device toward the light receiving device.

According to the optical-coupling semiconductor device of the fifth aspect in accordance with the present invention, in addition to any one of the first to third aspects, the light emitting device is situated on the primary support plate by situating, on the primary support plate, a first interposer substrate on which the light emitting device is mounted.

According to the optical-coupling semiconductor device of the sixth aspect in accordance with the present invention, in addition to the fifth aspect, a difference in linear-expansivity between the first interposer substrate and the light emitting device is smaller than a difference in linear-expansivity between the primary support plate and the light emitting device.

According to the optical-coupling semiconductor device of the seventh aspect in accordance with the present invention, in addition to any one of the first to third aspects, the light receiving device is situated on the secondary support plate by situating, on the secondary support plate, a second interposer substrate on which the light receiving device is mounted.

According to the optical-coupling semiconductor device of the eighth aspect in accordance with the present invention, in addition to the seventh aspect, a difference in linear-expansivity between the second interposer substrate and the light receiving device is smaller than a difference in linear-expansivity between the secondary support plate and the light receiving device.

According to the optical-coupling semiconductor device of the ninth aspect in accordance with the present invention, in addition to the first aspect, the primary support plate has a mounting surface on which the light emitting element is mounted, and the primary support plate includes a light reflective member on the mounting surface of the primary support plate.

According to the optical-coupling semiconductor device of the tenth aspect in accordance with the present invention, in addition to the fifth aspect, the first interposer substrate includes a mounting surface on which the light emitting element is mounted, and the first interposer substrate includes a light reflective portion on the mounting surface of the first interposer substrate.

According to the optical-coupling semiconductor device of the eleventh aspect in accordance with the present invention, in addition to any one of the first to third aspects, the optical-coupling semiconductor device further includes an encapsulating member encapsulating the light emitting device and the light receiving device. The encapsulating member includes at least one of openings in respective opposite surfaces of the encapsulating member in a direction in which the light emitting device and the light receiving device face each other. One of the openings exposes an opposite surface of a portion, on which the light emitting device is situated, of the primary support plate from the light emitting device, and the other exposes an opposite surface of a portion, on which the light receiving device is situated, of the secondary support plate from the light receiving device.

According to the optical-coupling semiconductor device of the twelfth aspect in accordance with the present invention, in addition to the eleventh aspect, the optical-coupling semiconductor device further includes a cover member covering a part, exposed via the corresponding opening, of the primary support plate and having a thermal emissivity higher than a thermal emissivity of the encapsulating member, and/or a cover member covering a part, exposed via the corresponding opening, of the secondary support plate and having a thermal emissivity higher than the thermal emissivity of the encapsulating member.

According to the optical-coupling semiconductor device of the thirteenth aspect in accordance with the present invention, in addition to the twelfth aspect, each cover member has electrically insulating properties.

Alternatively, the optical-coupling semiconductor device of the fourteenth aspect in accordance with the present invention includes: a primary support plate and a secondary support plate; a light emitting device; a light receiving device; an encapsulating member; a primary electrically conductive plate; and a secondary electrically conductive plate. The primary support plate and the secondary support plate face each other and are spaced apart a predetermined distance. The light emitting device is situated on a surface facing the secondary support plate of the primary support plate so that a light emitting surface of the light emitting device is oriented toward the secondary support plate. The light receiving device is situated on a surface facing the primary support plate of the secondary support plate so that a light receiving surface of the light receiving device faces the light emitting surface so as to receive light from the light emitting surface. The encapsulating member encapsulates the light emitting device and the light receiving device and holds the primary support plate and the secondary support plate. The primary electrically conductive plate is electrically connected to the light emitting device and includes a part uncovered by the encapsulating member. The secondary electrically conductive plate is electrically connected to the light receiving device and includes a part uncovered by the encapsulating member. A plate member, which serves as the secondary support plate, has electrically conductive properties so as to also serve as the secondary electrically conductive plate. The primary support plate has thermally conductive properties and is separate from the primary electrically conductive plate.

Owing to this configuration, the efficiency of transfer of signals from the light emitting device to the light receiving device can be improved and thus the optical-coupling semiconductor device can have the more improved reliability of light transfer.

According to the optical-coupling semiconductor device of the fifteenth aspect in accordance with the present invention, in addition to the fourteenth aspect, the light emitting device is on the light receiving surface of the light receiving device.

According to the optical-coupling semiconductor device of the sixteenth aspect in accordance with the present invention, in addition to the fourteenth or fifteenth aspect, the optical-coupling semiconductor device further includes a connection plate to electrically connect the primary support plate to a circuit ground of a primary circuit to be electrically connected to the light emitting device.

According to the optical-coupling semiconductor device of the seventeenth aspect in accordance with the present invention, in addition to the fourteenth aspect, the encapsulating member includes a first surface close to the primary support plate in a direction in which the primary support plate and the secondary support plate face each other, and includes an opening in the first surface. An opposite surface of a portion, to which the light emitting device is attached, of the primary support plate from the light emitting device includes a face of the primary support plate exposed via the opening.

According to the optical-coupling semiconductor device of the eighteenth aspect in accordance with the present invention, in addition to the seventeenth aspect, the encapsulating member is formed so that a vicinity of the opening of the first surface is flush with the face of the primary support plate exposed via the opening.

According to the optical-coupling semiconductor device of the nineteenth aspect in accordance with the present invention, in addition to the seventeenth or eighteenth aspect, the optical-coupling semiconductor device further includes a cover member covering the face of the primary support plate exposed via the opening. The cover member has a thermal emissivity higher than a thermal emissivity of the encapsulating member.

BRIEF DESCRIPTION OF THE DRAWINGS

FIG. 11A is an explanatory plan view illustrating a primary part of the semiconductor relay including the optical-coupling semiconductor device of the fifth embodiment.

FIG. 11B is an explanatory sectional view taken along the line X-X of FIG. 11A.

FIG. 12 is an explanatory sectional view illustrating the first modification of the fifth embodiment.

DETAILED DESCRIPTION

First Embodiment

The optical-coupling semiconductor device 10 of the present embodiment is described with reference to FIGS. 1 to 6. In these FIGS., the same components are designated by the same reference signs.

Figure 1:
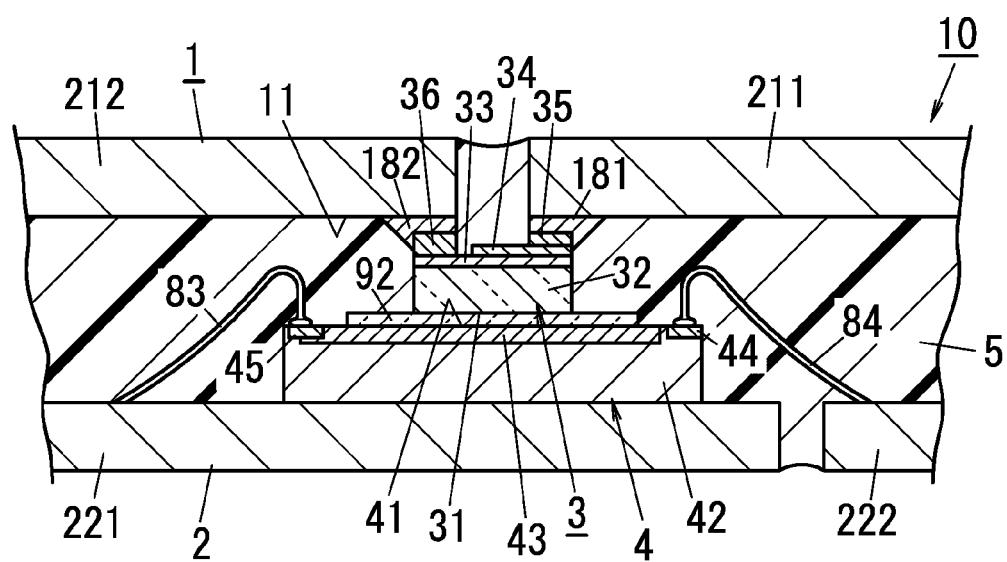
FIG. 1 is a schematic sectional view illustrating the optical-coupling semiconductor device of the first embodiment.
Figure 2:
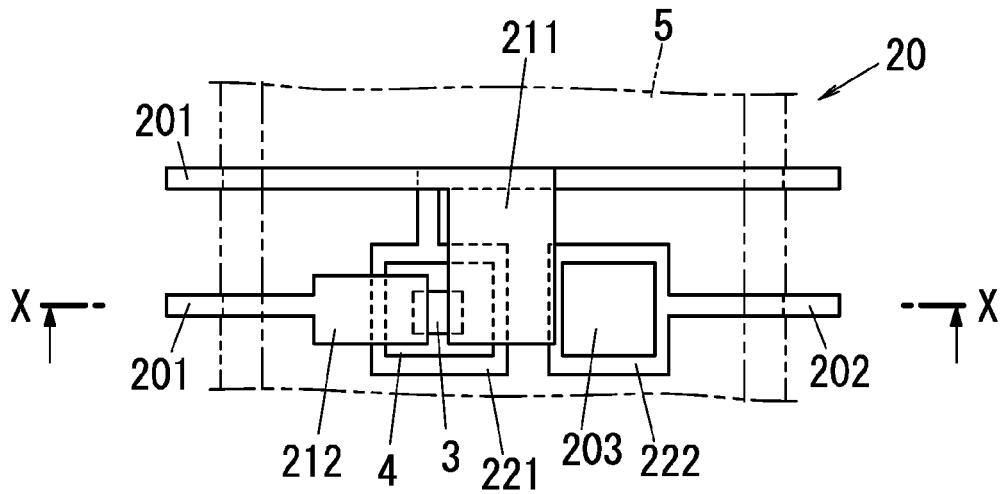
FIG. 2A is an explanatory plan view illustrating a primary part of the semiconductor relay including the optical-coupling semiconductor device of the first embodiment.
FIG. 2B is an explanatory sectional view taken along the line X-X of FIG. 2A.
Figure 2:
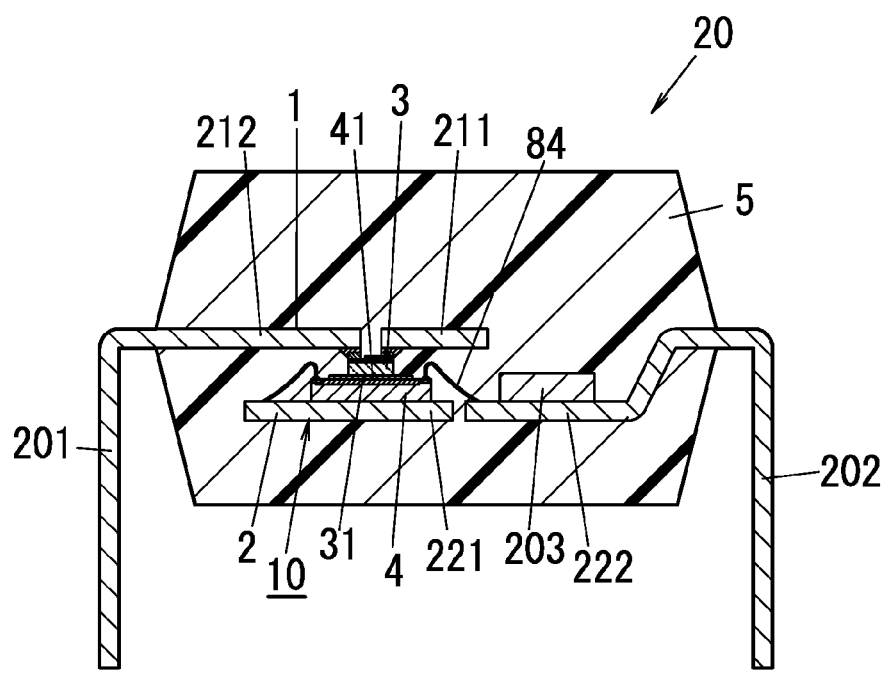

As shown in FIG. 1, the optical-coupling semiconductor device 10 of the present embodiment includes a light emitting device 3, a light receiving device 4, a primary support plate 1, and a secondary support plate 2. The light receiving device 4 is placed opposite the light emitting device 3 and to receive light from the light emitting device 3. The primary support plate 1 bears the light emitting device 3. The secondary support plate 2 bears the light receiving device 4. In the optical-coupling semiconductor device 10, the light emitting device 3 is placed on the light receiving device 4 so that a light emitting surface 31 of the light emitting device 3 faces a light receiving surface 41 of the light receiving device 4. The opposite side of the light emitting device 3 from the light emitting surface 31 in a thickness direction of the light emitting device 3 is fixed to the primary support plate 1.

In other words, the optical-coupling semiconductor device 10 includes: the light emitting device 3; the light receiving device 4 placed to face the light emitting device 3; the primary support plate 1 on which the light emitting device 3 is situated; and the secondary support plate 2 on which the light receiving device 4 is situated. The light emitting device 3 is placed on the light receiving surface 41 of the light receiving device 4 so that the light emitting surface 31 is oriented toward (faces) the light receiving surface 41 of the light receiving device 4. In short, the light emitting device 3 is supported on the light receiving device 4 so that the light emitting surface 31 and the light receiving surface 41 face each other without leaving a substantial gap between the light emitting device 3 and the light receiving device 4.

In this regard, the light emitting surface 31 is one surface, from which light is to emerge, of the light emitting device 3. In the example shown in FIG. 1, the light emitting surface 31 is an opposite surface (lower surface) of a light transmissive insulating substrate 32 from a light emitting unit (an n-type nitride semiconductor layer 33 and a p-type nitride semiconductor layer 34). The light receiving surface 41 is one surface, to receive light, of the light receiving device 4. In the example shown in FIG. 1, the light receiving surface 41 is an opposite surface (upper surface) of a p-type region 43 of an n-type silicon substrate 42 from the secondary support plate 2. The opposite side of the light emitting device 3 from the light emitting surface 31 in the thickness direction of the light emitting device 3, that is, a direction normal to the light emitting surface 31 (an upward and downward direction in FIG. 1) is fixed to the primary support plate 1.

In other words, the optical-coupling semiconductor device 10 in accordance of the present embodiment includes: the primary support plate 1 and the secondary support plate 2, the light emitting device 3, and the light receiving device 4. The primary support plate 1 and the secondary support plate 2 are arranged so as to face each other and be spaced apart a predetermined distance. The light emitting device 3 is situated on a surface facing the secondary support plate 2 of the primary support plate 1 so that the light emitting surface 31 of the light emitting device 3 is oriented toward the secondary support plate 2. The light receiving device 4 is situated on a surface facing the primary support plate 1 of the secondary support plate 2 so that the light receiving surface 41 of the light receiving device 4 faces the light emitting surface 31 so as to receive light from the light emitting surface 31. The light emitting device 3 is on the light receiving surface 41 of the light receiving device 4.

A condition in which the light emitting device 3 is on (placed on) the light receiving surface 41 of the light receiving device 4 includes not only a condition in which the light emitting device 3 is directly on (in direct contact with) the light receiving device 4, but also a condition in which the light emitting device 3 is indirectly situated on the light receiving device 4. In brief, interposed between the light emitting device 3 and the light receiving device 4 may be an additional member exemplified by an optical-coupling member 92 shown in FIG. 1. However, such an additional member is optional.

However, to satisfy the condition in which the light emitting device 3 is on the light receiving surface 41 of the light receiving device 4, it is necessary at least that the light emitting device 3 and the light receiving device 4 are thermally coupled with each other effectively. The condition in which the light emitting device 3 and the light receiving device 4 are thermally coupled with each other effectively means a condition in which heat generated in the light emitting device 3 is effectively transferred to the light receiving device 4 through heat transfer or heat radiation causing transferring heat from the light emitting device 3 to the light receiving device 4. For example, the condition in which the light emitting device 3 and the light receiving device 4 are thermally coupled with each other effectively means a condition in which heat generated in the light emitting device 3 is transferred to the light receiving device 4 and further such heat is transferred from the light receiving device 4 to the secondary support plate 2 and then is dissipated. In short, in the condition where the light emitting device 3 is on the light receiving surface 41 of the light receiving device 4, even when an additional member is between the light emitting device 3 and the light receiving device 4, heat generated in the light emitting device 3 is transferred from the light emitting device 3 to the light receiving device 4 by way of the additional member, and is transferred from the light receiving device 4 to the secondary support plate 2, and then is dissipated.

In summary, in the optical-coupling semiconductor device 10 of the present embodiment, the light emitting device 3 is on the light receiving surface 41 of the light receiving device 4 and thus the light receiving device 4 and the secondary support plate 2 form a heat dissipation path for heat generated in the light emitting device 3.

Additionally, in the optical-coupling semiconductor device 10 of the present embodiment, the light emitting device 3 is situated on the primary support plate 1 and thereby heat generated by the light emitting device 3 can be dissipated outside through the primary support plate 1. Accordingly, in the optical-coupling semiconductor device 10 of the present embodiment, heat generated by the light emitting device 3 is dissipated through the heat dissipation path and also is dissipated through the primary support plate 1. As a result, the optical-coupling semiconductor device 10 has heat dissipation efficiency greater than a heat dissipation efficiency of a structure in which simply the light receiving device 4 and the light emitting device 3 are stacked, and thus the optical-coupling semiconductor device 10 can suppress a decrease in the light emission efficiency. Hence, the reliability of light transfer of the optical-coupling semiconductor device 10 of the present embodiment can be more improved.

Hereinafter, the optical-coupling semiconductor device 10 of the present embodiment is described in more detail. Note that, the optical-coupling semiconductor device 10 described below is merely one example of the present invention, and the scope of the present invention is not limited to the following embodiments, and other embodiments, modifications, and variations can be made depending on various applications unless they are deviated from the technical concept of the present invention.

The first explanation referring to FIG. 2A and FIG. 2B is made to a semiconductor relay 20 including the optical-coupling semiconductor device 10 of the present embodiment. The semiconductor relay 20 is a contactless relay which is different from a mechanical relay in not having a movable contact part. The semiconductor relay 20 is available for control of devices such as security devices, amusement machines, medical devices, rechargeable battery systems, heaters, and DC motors.

The semiconductor relay 20 may be produced by use of a switching device 203 such as a MOSFET (Metal-Oxide-Semiconductor-Field-Effect Transistor). In the semiconductor relay 20, the switching device 203 is corresponding to a set of a movable contact and a fixed contact of a mechanical relay. In the semiconductor relay 20, the optical-coupling semiconductor device 10 is available for controlling the state of the switching device 203.

In the semiconductor relay 20, the light emitting device 3 and the light receiving device 4 are arranged to face each other. Further, the semiconductor relay 20 includes the switching device 203. The semiconductor relay 20 includes a pair of leads 211 and 212, and one lead 211 and the other lead 212 are individually electrically connected to different parts of the light emitting device 3. The leads 211 and 212 cooperate to carry the light emitting device 3. Further, the semiconductor relay 20 includes a pair of leads 221 and 222. One lead 221 carries the light receiving device 4 and the other lead 222 carries the switching device 203. In the semiconductor relay 20, the light emitting device 3 is placed on the light receiving device 4 so that the light emitting surface 31 faces the light receiving surface 41. In other words, the light emitting device 3 is placed on the light receiving surface 41 of the light receiving device 4.

In the semiconductor relay 20, the light receiving device 4 is electrically connected by a bonding wire 84 to a gate terminal (not shown) of the switching device 203 that is a MOSFET. The semiconductor relay 20 has a structure in which the light emitting device 3, the light receiving device 4, the switching device 203, and parts of the respective leads 211, 212, 221, and 222 are encapsulated by an encapsulating member (encapsulating resin part) 5.

The encapsulating member 5 covers the light emitting device 3 and the light receiving device 4 and thus it is possible to physically protect the light emitting device 3 and the light receiving device 4. The encapsulating member 5 may be made of material such as epoxy resin, silicone resin, and polyimide resin. The encapsulating member 5 may contain thermal conductivity fillers. The thermal conductivity filler may be made of aluminum nitride or magnesium oxide, for example. The encapsulating member 5 may contain light reflecting fillers. The light reflecting filler may be made of silicon oxide or titanium oxide, for example. The encapsulating member 5 may be made of silicone resin containing black pigment, for example.

In the semiconductor relay 20, the leads 211 and 212 electrically connected to the light emitting device 3 serve as input terminals 201 of the semiconductor relay 20. Further, in the semiconductor relay 20, a pair of leads electrically and individually connected to a source terminal and a drain terminal of the switching device 203 serve as output terminals 202 of the semiconductor relay 20. Although FIG. 2A and FIG. 2B show only one of the output terminals 202, the semiconductor relay 20 includes a pair of output terminals 202. In the semiconductor relay 20, when energy is supplied to the light emitting device 3 through the input terminals 201 of the semiconductor relay 20, the light emitting device 3 emits light.

In the semiconductor relay 20, a voltage given by a photovoltaic effect of the light receiving device 4 receiving light from the light emitting device 3 is applied to a gate terminal of the switching device 203 as a gate voltage of the switching device 203. When the gate voltage is applied to the switching device 203, the semiconductor relay 20 switches the switching device 203 to an on-state. When the switching device 203 is in the on-state, the semiconductor relay 20 can supply electric power derived from a voltage between the source terminal and the drain terminal of the switching device 203 to a load (not shown) through the output terminals 202 of the semiconductor relay 20. While a current to the input terminals 201 of the semiconductor relay 20 is smaller than a predetermined value, the semiconductor relay 20 keeps the switching device 203 in an off-state. The semiconductor relay 20 can turn on and off the switching device 203 depending on a magnitude of the current to the input terminals 201 of the semiconductor relay 20. In summary, the semiconductor relay 20 is configured such that it is possible to control, by use of light emitted from the light emitting device 3 and received by the light receiving device 4, whether the switching device 203 allows a current to flow therethrough.

Even when a voltage across the light emitting device 3 is greatly different from a voltage across the light receiving device 4, the semiconductor relay 20 can transfer signals while electrically insulating the light emitting device 3 and the light receiving device 4 from each other successfully. Thus it is possible to improve the reliability.

The optical-coupling semiconductor device 10 of the present embodiment includes at least the light emitting device 3, the light receiving device 4, and the leads 211, 212, and 221 of components of the semiconductor relay 20 described above. In summary, in the optical-coupling semiconductor device 10, the pair of leads 211 and 212 serves as the primary support plate 1 on which the light emitting device 3 is situated. Further, in the optical-coupling semiconductor device 10, one lead 221 of the pair of leads 221 and 222 serves as the secondary support plate 2 on which the light receiving device 4 is situated.

Hereinafter, the optical-coupling semiconductor device 10 of the present embodiment is described in more detail.

In the optical-coupling semiconductor device 10 of the present embodiment, the light emitting device 3 is a light emitting diode. As shown in FIG. 1, the light emitting device 3 may have a structure in which a light emitting unit is on a sapphire substrate serving as the light transmissive insulating substrate 32, for example. The light emitting unit may include the n-type nitride semiconductor layer 33 and the p-type nitride semiconductor layer 34. In the light emitting device 3, the p-type nitride semiconductor layer 34 is partially removed and thus the n-type nitride semiconductor layer 33 is partially exposed. The light emitting device 3 includes a p-type electrode 35 electrically connected to the p-type nitride semiconductor layer 34. The light emitting device 3 includes an n-type electrode 36 electrically connected to an exposed part of the n-type nitride semiconductor layer 33. The p-type electrode 35 and the n-type electrode 36 are formed on the same side of the light emitting device 3. The light emitting device 3 emits light in response to application of a voltage between the p-type electrode 35 and the n-type electrode 36.

The light emitting device 3 is situated on the primary support plate 1. As described above, the primary support plate 1 is constituted by the pair of leads 211 and 212. The leads 211 and 212 may be made of metal. Examples of material of the leads 211 and 212 include aluminum, copper, iron, and various types of alloys. In the light emitting device 3, the p-type electrode 35 is electrically connected to one lead 211 of the pair of leads 211 and 212 by a solder 181, and similarly, in the light emitting device 3, the n-type electrode 36 is electrically connected to the other lead 212 of the pair of leads 211 and 212 by a solder 182. The solders 181 and 182 serve as bonding parts electrically connecting the light emitting device 3 to the primary support plate 1. Note that, the primary support plate 1 is not limited to the structure constituted by the leads 211 and 212. For example, the primary support plate 1 may be made of a ceramic substrate or a glass epoxy substrate.

In the optical-coupling semiconductor device 10 of the present embodiment, the light receiving device 4 is a photodiode. The light receiving device 4 may include the p-type region 43 formed by doping the n-type silicon substrate 42 with p-type impurities. The light receiving device 4 includes an n-type electrode 44 electrically connected to the n-type silicon substrate 42 and a p-type electrode 45 electrically connected to the p-type region 43. The light receiving device 4 can provide a current having a magnitude corresponding to light received by the light receiving device 4 from the p-type region 43 through the n-type electrode 44.

The light receiving device 4 is situated on the secondary support plate 2. The light receiving device 4 may be fixed on the secondary support plate 2 by use of a bonding member (not shown) such as epoxy resin and silicone resin, for example. As described above, the secondary support plate 2 is constituted by the lead 221. The lead 221 may be made of metal. Examples of material of the lead 221 include aluminum, copper, iron, and various types of alloys. In the light receiving device 4, the p-type electrode 45 is electrically connected to one lead 221 of the pair of leads 221 and 222 by a bonding wire 83, and in the light receiving device 4, the n-type electrode 44 is electrically connected to the other lead 222 of the pair of leads 221 and 222 by the bonding wire 84. The secondary support plate 2 is not limited to the lead 221. For example, the secondary support plate 2 may be made of a glass epoxy substrate or a ceramic substrate.

The secondary support plate 2 may carry two or more electronic components such as the switching device 203, diodes, resistors, capacitors, transistors, varistors, and ICs, in addition to the light receiving device 4. In the optical-coupling semiconductor device 10, an appropriate set of two or more electronic components situated on the secondary support plate 2 may constitute a control circuit for controlling the switching device 203 of the semiconductor relay 20.

Note that, in the optical-coupling semiconductor device 10 of the present embodiment, the light emitting device 3 is placed on the light receiving device 4 so that the light emitting surface 31 is oriented toward the light receiving surface 41 and the optical-coupling member 92 having light transmissive properties is interposed between the light emitting surface 31 and the light receiving surface 41. Further, the light emitting device 3 includes a light transmissive insulating substrate 32 which allows passage of light emitted from the light emitting device 3, has electrically insulating properties, and includes a surface defining the light emitting surface 31. The optical-coupling member 92 has electrically insulating properties and is interposed between the light transmissive insulating substrate 32 and the light receiving surface 41 of the light receiving device 4.

In the optical-coupling semiconductor device 10 of the present embodiment, the optical-coupling member 92 is situated between the light emitting device 3 and the light receiving device 4, and thus it is possible to reduce an amount of light absorbed by multiple reflection inside the light emitting device 3 and increase an amount of light emerging from the light emitting device 3. Further, in the optical-coupling semiconductor device 10 of the present embodiment, the light emitting device 3 includes the light transmissive insulating substrate 32 and therefore it is possible to thin the optical-coupling member 92 between the light emitting device 3 and the light receiving device 4 and decrease the area of the optical-coupling member 92. Consequently, the optical-coupling semiconductor device 10 can have the improved light coupling efficiency between the light emitting device 3 and the light receiving device 4.

The optical-coupling member 92 may be made of epoxy resin, silicone resin, poly(methyl methacrylate) resin, or glass. The optical-coupling member 92 may also serve as a bonding material for bonding the light emitting device 3 to the light receiving device 4.

As described above, an additional member such as the optical-coupling member 92 may or may not be interposed between the light emitting device 3 and the light receiving device 4. Hence, the optical-coupling semiconductor device 10 is not limited to the structure in which the light emitting device 3 is placed on the light receiving surface 41 of the light receiving device 4 while the optical-coupling member 92 is between the light emitting device 3 and the light receiving surface 41. In other words, in this optical-coupling semiconductor device 10, the optical-coupling member 92 may be omitted and the light emitting device 3 may be directly placed on the light receiving surface 41 of the light receiving device 4.

In the optical-coupling semiconductor device 10 of the present embodiment, the light emitting device 3 is placed on the light receiving device 4. However, the light emitting device 3 is situated on the primary support plate 1 and the light receiving device 4 is situated on the secondary support plate 2. In the optical-coupling semiconductor device 10, the light emitting device 3 is placed on the light receiving device 4 so that the light emitting surface 31 is oriented toward the light receiving surface 41, and therefore a distance between the light emitting device 3 and the light receiving device 4 can be shortened. In the optical-coupling semiconductor device 10, an area of the light receiving device 4 to be irradiated with the light from the light emitting device 3 can be more decreased by more shortening the distance between the light emitting device 3 and the light receiving device 4. In the optical-coupling semiconductor device 10, the light receiving device 4 produces a desired photocurrent, and therefore an increase in power consumption of the light emitting device 3 can be reduced.

In the light coupling semiconductor device, an increase in the distance between the light emitting device 3 and the light receiving device 4 causes an increase in a light receiving area of the light receiving device 4, and therefore it is necessary to increase light receiving sensitivity of the light receiving device 4. In the optical-coupling semiconductor device 10, the distance between the light emitting device 3 and the light receiving device 4 is relatively short. Therefore, the light emitting device 3 can detect light from the light emitting device 3 even when the light from the light emitting device 3 is weak. Accordingly, it is possible to reduce power consumption of the optical-coupling semiconductor device 10.

In the optical-coupling semiconductor device 10 of the present embodiment, the light emitting device 3 is placed on the light receiving device 4, and thus the whole of the optical-coupling semiconductor device 10 can be thinned. Further, in the optical-coupling semiconductor device 10, the irradiated area of the light receiving device 4 is decreased, and therefore it is possible to improve the light coupling efficiency or decrease the area of the light receiving surface 41 of the light receiving device 4.

In the optical-coupling semiconductor device 10, the light emitting device 3 is mounted on the primary support plate 1, and therefore heat generated by the light emitting device 3 can be dissipated outside through the primary support plate 1.

This point is explained below. When the light coupling semiconductor device has a structure in which the light receiving device 4 and the light emitting device 3 are stacked, it can have the improved light transfer efficiency with regard to light from the light emitting device 3 to the light receiving device 4. However, according to the light coupling semiconductor device having the simple structure in which the light receiving device 4 and the light emitting device 3 are stacked, a path for dissipation of heat generated by the light emitting device 3 caused by operation of the light emitting device 3 is limited. For example, in the simple structure in which the light receiving device 4 and the light emitting device 3 are stacked, heat generated by the light emitting device 3 is transferred from the light emitting device 3 and dissipated through the light receiving device 4 and the lead 221, or is dissipated through the encapsulating member 5. Hence, according to the light coupling semiconductor device with the simple structure in which the light receiving device 4 and the light emitting device 3 are stacked, the light emission efficiency of the light emitting device 3 may be decreased.

In contrast, according to the optical-coupling semiconductor device 10 of the present embodiment, heat generated by the light emitting device 3 is dissipated through the primary support plate 1 in addition to the aforementioned paths. Consequently, in the optical-coupling semiconductor device 10, the primary support plate 1 successfully forms the heat dissipation path for heat generated by the light emitting device 3, and thus the optical-coupling semiconductor device 10 has the heat dissipation efficiency greater than the heat dissipation efficiency of the simple structure in which the light receiving device 4 and the light emitting device 3 are stacked, and hence it is possible to reduce a decrease in the light emission efficiency.

Figure 3:
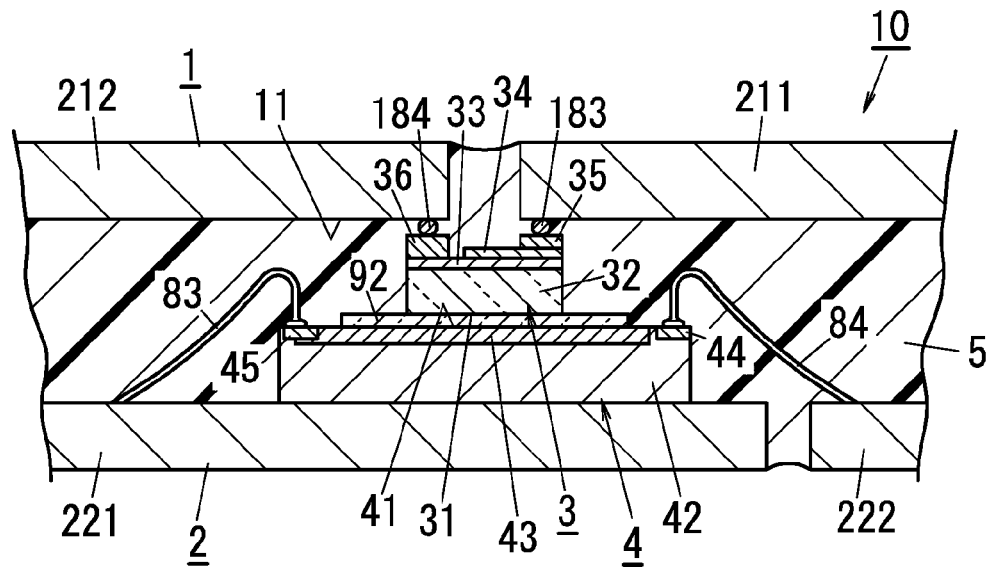
FIG. 3 is a schematic sectional view illustrating the optical-coupling semiconductor device of another example of the first embodiment.

Note that, as shown in FIG. 3, in another example of the optical-coupling semiconductor device 10 of the present embodiment, the p-type electrode 35 of the light emitting device 3 may be electrically connected to one lead 211 of the pair of leads 211 and 212 by use of a bump 183, and the n-type electrode 36 of the light emitting device 3 may be electrically connected to the other lead 212 of the pair of leads 211 and 212 by use of a bump 184. In this example, the bumps 183 and 184 constitute bonding parts eclectically connecting the light emitting device 3 to the primary support plate 1.

Figure 4:
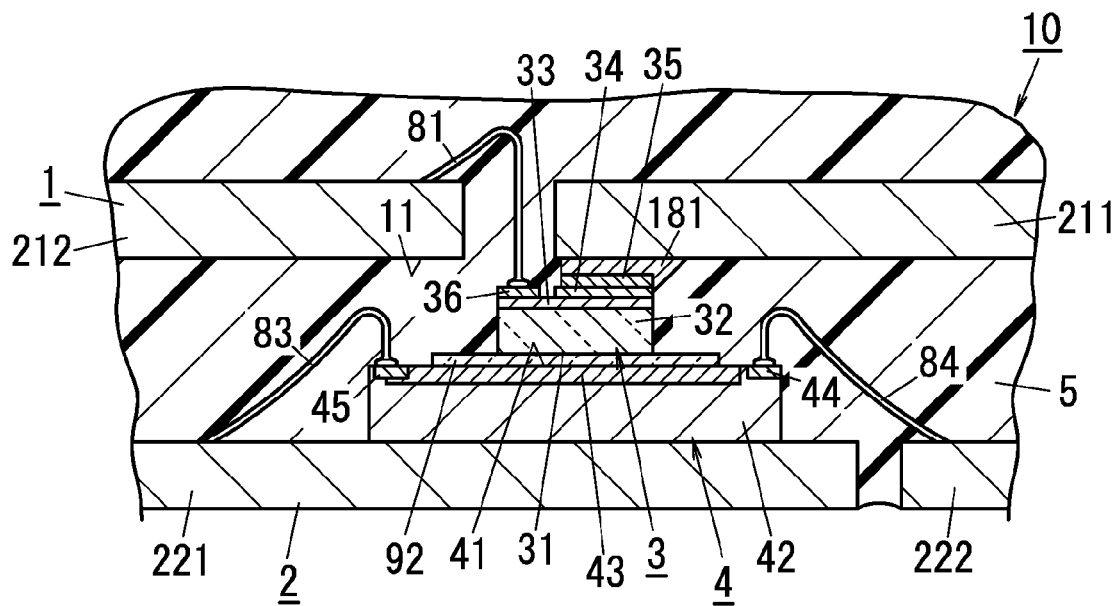
FIG. 4 is a schematic sectional view illustrating the optical-coupling semiconductor device of another example of the first embodiment.

FIG. 4 shows another example of the optical-coupling semiconductor device 10. In this example, the light emitting device 3 is fixed to the primary support plate 1 while the p-type electrode 35 of the light emitting device 3 is electrically connected to one of the pair of leads 211 and 212 by use of the solder 181, and the n-type electrode 36 of the light emitting device 3 may be electrically connected to the other lead 212 of the pair of leads 211 and 212 by use of a bonding wire 81. In this example, the bonding wire 81 serves as a bonding part electrically connecting the light emitting device 3 to the primary support plate 1. The bonding wire 81 may be made of metal such as gold and aluminum, for example.

Figure 5:
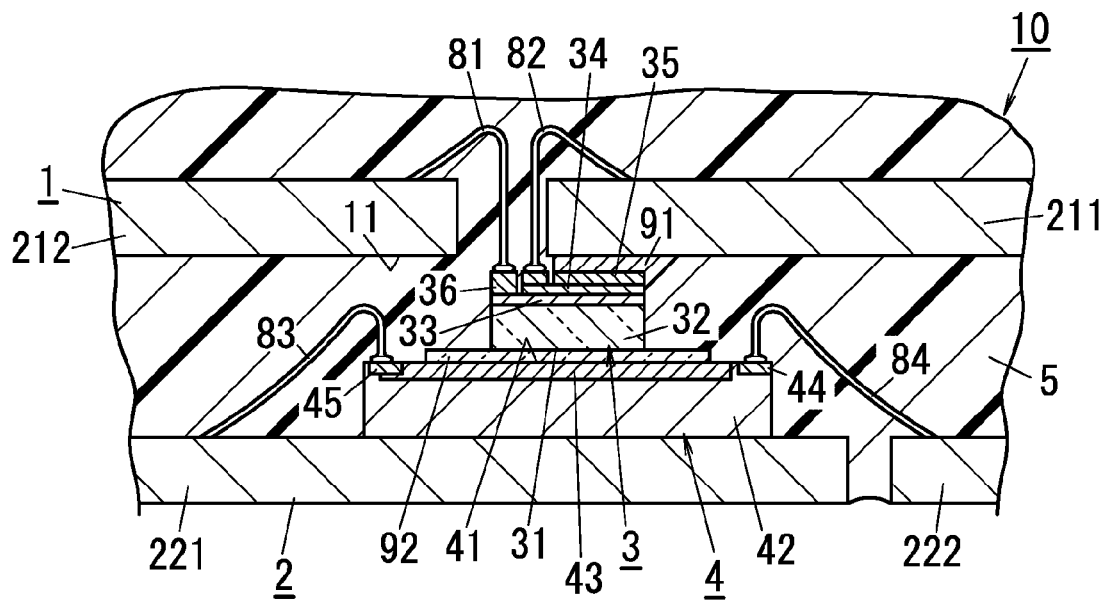
FIG. 5 is a schematic sectional view illustrating the optical-coupling semiconductor device of another example of the first embodiment.

FIG. 5 shows another example of the optical-coupling semiconductor device 10. In this example, the light emitting device 3 is fixed to the primary support plate 1 by use of a coupling member 91 such as adhesive. In the optical-coupling semiconductor device 10 shown in FIG. 5, the p-type electrode 35 of the light emitting device 3 is electrically connected to one lead 211 of the pair of leads 211 and 212 through a bonding wire 82, and the n-type electrode 36 of the light emitting device 3 is electrically connected to the other lead 212 of the pair of leads 211 and 212 through the bonding wire 81.

Figure 6:
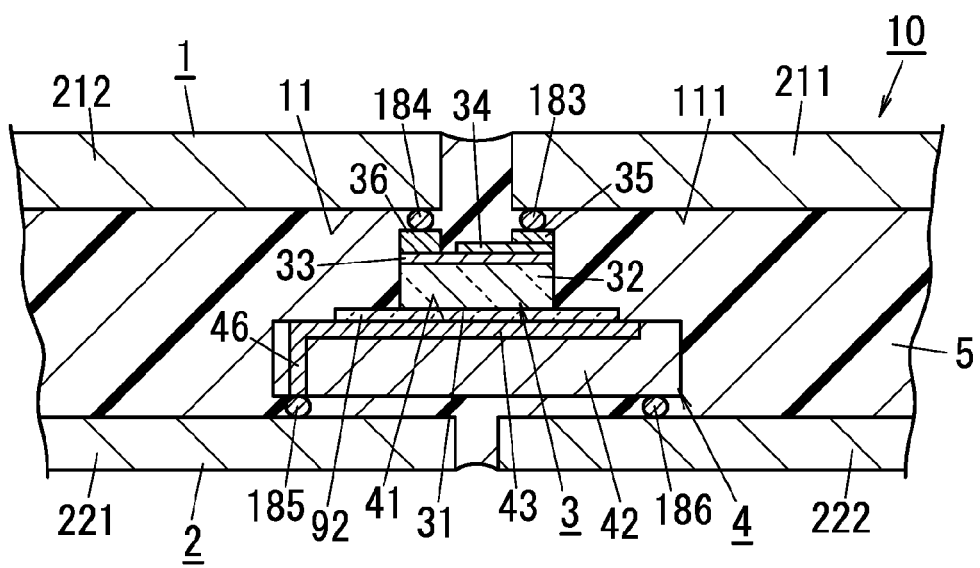
FIG. 6 is a schematic sectional view illustrating the optical-coupling semiconductor device of another example of the first embodiment.

FIG. 6 shows another example of the optical-coupling semiconductor device 10. In this example, the light receiving device 4 is fixed to the secondary support plate 2 by use of a bump 185. In the optical-coupling semiconductor device 10 shown in FIG. 6, the light receiving device 4 includes a penetrating electrode 46 that penetrates through the n-type silicon substrate 42 in the thickness direction of the light receiving device 4. The penetrating electrode 46 is constituted by an electrical conductor formed inside a through hole penetrating through the n-type silicon substrate 42 in the thickness direction while an insulating layer is entirely interposed between the electrical conductor and an inner surface of the through hole. In the optical-coupling semiconductor device 10 shown in FIG. 6, the p-type region 43 of the light receiving device 4 is electrically connected to one lead 221 of the pair of leads 221 and 222 through the penetrating electrode 46 and the bump 185, and the n-type silicon substrate 42 of the light receiving device 4 is electrically connected to the other lead 222 of the pair of leads 221 and 222 by use of a bump 186.

In each example according to the optical-coupling semiconductor device 10 of the present embodiment, the light emitting device 3 is situated on the primary support plate 1 and the light receiving device 4 is situated on the secondary support plate 2. Further, in each example according to the optical-coupling semiconductor device 10 of the present embodiment, the light emitting device 3 is placed on the light receiving device 4 so that the light emitting surface 31 faces the light receiving surface 41. Accordingly, each example according to the optical-coupling semiconductor device 10 of the present embodiment can have the improved light transfer reliability.

Hereinafter, each component of the optical-coupling semiconductor device 10 is described in detail.

The light emitting device 3 is configured to, when receiving electric power, emit light to be received by the light receiving device 4, from the light emitting surface 31. The light emitting device 3 can transfer an optical signal outputted from the light emitting device 3 to the light receiving device 4. The light emitting device 3 may be an LED (Light Emitting Diode) or an LD (Laser Diode), for example. The light emitting device 3 is formed by use of semiconductor material appropriately selected according to a wavelength of desired light. For example, with regard to light such as ultraviolet and visible light with a relatively short wavelength, nitride semiconductor is preferable. For example, with regard to light such as visible light with a relatively long wavelength and infrared, aluminum indium gallium phosphide semiconductor is preferable.

The light emitting device 3 may be mounted on the primary support plate 1 by use of the solders 181 and 182. Each of the solders 181 and 182 may be a Pb-free Sn solder, an Sn—Pb eutectic solder or another eutectic solder such as an Au—Sn solder and an Au—Si solder. A method of mounting the light emitting device 3 to the primary support plate 1 is not limited to a method using the solders 181 and 182. For example, the light emitting device 3 may be mounted on the primary support plate 1 by use of conductive pates (e.g., epoxy resin containing an Ag powder). Alternatively, the light emitting device 3 may be mounted by use of the bonding wires 81 and 82.

Alternatively, the light emitting device 3 may be mounted by flip-chip bonding so that the light emitting device 3 is electrically and physically connected by use of the bumps 183 and 184 that are protruded terminals, without using the bonding wires 81 and 82. In short, the light emitting device 3 may be mounted on the primary support plate 1 by use of the bumps 183 and 184. In the case where the light emitting device 3 is connected by use of the bonding wires 81 and 82, when the primary support plate 1 and the secondary support plate 2 are arranged opposite each other, damages caused by deformation and breakage of the bonding wires 81 and 82 may occur. However, the flip-chip bonding does not cause such damages. Further, in the optical-coupling semiconductor device 10, heat generated by the light emitting device 3 is easily transferred to the primary support plate 1.

When the light emitting device 3 is mounted on the primary support plate 1 through the flip-chip bonding, it is possible to make the light emitting unit closer to the primary support plate 1. Therefore, heat transfer from the light emitting device 3 to the primary support plate 1 is facilitated. When the light emitting device 3 is mounted on the primary support plate 1 through the flip-chip bonding, there is no need to provide the p-type electrode 35 and the n-type electrode 36 on the side of the light emitting device 3 close to the light receiving device 4. By using the flip-chip bonding, it is possible to suppress obscuring of light from the light emitting device 3 by the p-type electrode 35 and the n-type electrode 36, and thus the light use efficiency can be improved. In the optical-coupling semiconductor device 10, the p-type electrode 35 and the n-type electrode 36 are not provided on the side of the light emitting device 3 close to the light receiving device 4, and therefore an amount of light reaching the light receiving device 4 is increased and the light coupling efficiency is improved. Additionally, in the optical-coupling semiconductor device 10, the bonding wires 81 and 82 are unnecessary, and thus the whole of the optical-coupling semiconductor device 10 can be thinned.

The light receiving device 4 is configured to cause photoelectric conversion when receiving light from the light emitting device 3 by the light receiving surface 41. The light receiving device 4 may be a photodiode, a phototransistor, or a solar cell, for example. It is sufficient that the light receiving device 4 has the good photoelectric conversion efficiency for light outputted from the light emitting device 3. For absorption of light such as visible light with a relatively long wavelength and infrared, the light receiving device 4 may be made of silicon semiconductor. Alternatively, for absorption of light such as visible light with a relatively short wavelength and ultraviolet, the light receiving device 4 may be made of nitride semiconductor. In order that the light receiving device 4 and the light emitting device 3 have the substantially same temperature properties, the light emitting device 3 and the light receiving device 4 may be made of the same material.

In the optical-coupling semiconductor device 10, the light receiving device 4 may be mounted on the secondary support plate 2 by use of electrically conductive paste formed by epoxy-based resin or solders such as a Pb-free Sn solder, an Sn—Pb eutectic solder or another eutectic solder such as an Au—Sn solder and an Au—Si solder.

The primary support plate 1 allows the light emitting device 3 to be mounted on the primary support plate 1. For example, the primary support plate 1 is constituted by the pair of leads 211 and 212. The primary support plate 1 is not limited to the pair of leads 211 and 212. The primary support plate 1 may be made of a ceramic substrate or a glass epoxy substrate. The primary support plate 1 may be a single layer substrate or a multilayer substrate. With regard to a mounting surface 11 of the primary support plate 1 on which the light emitting device 3 is mounted, a light reflecting member 111 (see FIG. 6) may be formed to cover most of surface of the primary support plate 1 facing the light emitting device 3 and is apart from wirings constituting a patterned circuit on the primary support plate 1. The light reflecting member 111 may be made of the same material as material of the wirings constituting the patterned circuit, or different material. When the light reflecting member 111 is made of the same material as the wirings, the light reflecting member 111 and the wirings can be formed on the primary support plate 1 simultaneously. For examples, the light reflecting member 111 can be formed on the primary support plate 1 by subjecting surfaces of the leads 211 and 212 to a plating process. The light reflecting member 111 may be made of aluminum, copper, silver, or gold, for example.

The secondary support plate 2 allows the light receiving device 4 to be mounted on at least one surface of the secondary support plate 2. The secondary support plate 2 may be the lead 221. With regard to the secondary support plate 2, a surface of the lead 221 may be subjected to a plating process using aluminum, copper, silver, or gold, for example. The secondary support plate 2 is not limited to the lead 221. The secondary support plate 2 may be made of a glass epoxy substrate or a ceramic substrate. The secondary support plate 2 may be a single layer substrate or a multilayer substrate. It is preferable that wirings constituting patterned circuits are on the opposite surfaces of the secondary support plate 2. The control circuit for controlling the switching device 203 may be formed by use of such wirings constituting the patterned circuits which are on the opposite surfaces of the secondary support plate 2.

Second Embodiment

Figure 7:
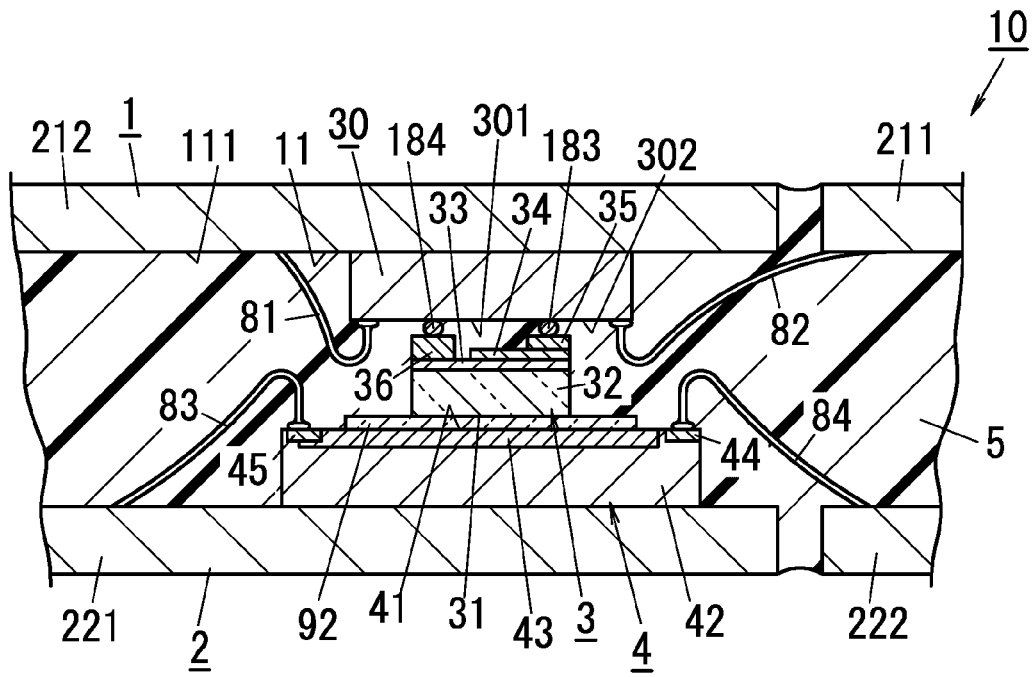
FIG. 7 is a schematic sectional view illustrating the optical-coupling semiconductor device of the second embodiment.

The optical-coupling semiconductor device 10 of the present embodiment shown in FIG. 7 is mainly different from the first embodiment of FIG. 1 in that the light emitting device 3 is situated on the primary support plate 1 by use of a first interposer substrate 30. Note that, components common to the present embodiment and the first embodiment are designated by the same reference signs and explanations thereof are deemed unnecessary.

As shown in FIG. 7, in the optical-coupling semiconductor device 10 of the present embodiment, the light emitting device 3 is situated on the primary support plate 1 by situating, on the primary support plate 1, the first interposer substrate 30 on which the light emitting device 3 is mounted.

In the optical-coupling semiconductor device 10 of the present embodiment, the light emitting device 3 is situated on the primary support plate 1 while the first interposer substrate 30 is interposed between the light emitting device 3 and the primary support plate 1. Therefore, the light emitting device 3 having accuracy of form higher than accuracy of form of the primary support plate 1 can be mounted with high accuracy.

Further, in the optical-coupling semiconductor device 10 of the present embodiment, a difference in linear-expansivity between the first interposer substrate 30 and the light emitting device 3 is smaller than a difference in linear-expansivity between the primary support plate 1 and the light emitting device 3.

According to the optical-coupling semiconductor device 10, even when the light emitting device 3, the primary support plate 1, and the first interposer substrate 30 are thermally expanded or contracted due to heat generation in the light emitting device 3, it is possible to reduce stress on electrically bonding parts of the light emitting device 3.

In the optical-coupling semiconductor device 10 of the present embodiment, the light emitting device 3 may be situated on the primary support plate 1 or the first interposer substrate 30 by the flip-chip bonding. In a process of electrically connecting the light emitting device 3 to wirings (not shown) on the first interposer substrate 30, it is possible to perform the flip-chip bonding so that the light emitting device 3 is electrically and physically connected by use of the bumps 183 and 184 that are protruded terminals, without using the bonding wires 81 and 82. In the case where the light emitting device 3 is connected by use of the bonding wires 81 and 82, when the primary support plate 1 and the secondary support plate 2 are arranged opposite each other, the bonding wires 81 and 82 are not likely to be damaged. Further, in the optical-coupling semiconductor device 10, heat generated by the light emitting device 3 can be transferred to the primary support plate 1 through the first interposer substrate 30.

Additionally, in the optical-coupling semiconductor device 10 of the present embodiment, the light reflecting member 111 may be provided to the mounting surface 11 of the primary support plate 1 on which the light emitting device 3 is mounted. In this case, light that is emitted from the light emitting device 3 and travels away from the light receiving device 4 is reflected, and thus the light coupling efficiency between the light emitting device 3 and the light receiving device 4 can be more improved.

The first interposer substrate 30 used in the optical-coupling semiconductor device 10 of the present embodiment is designed to be interposed between the light emitting device 3 and the primary support plate 1. The first interposer substrate 30 allows the light emitting device 3 to be mounted on a mounting surface 301 of the first interposer substrate 30. The first interposer substrate 30 is allowed to be fixed to the primary support plate 1. The first interposer substrate 30 may include the wirings (not shown) to be electrically connected to the light emitting device 3. The first interposer substrate 30 allows connecting the primary support plate 1 to the wirings electrically connected to the light emitting device 3. The first interposer substrate 30 may be made of a glass epoxy resin substrate or a silicon semiconductor substrate, for example.

Additionally, with regard to the first interposer substrate 30, a light reflecting part 302 may be formed on the mounting surface 301 of the first interposer substrate 30. When the first interposer substrate 30 is made of a glass epoxy substrate or a ceramic substrate, the light reflecting part 302 may be formed by use of part of patterned circuit formed on the mounting surface 301 of the first interposer substrate 30. It is preferable that the light reflecting part 302 have metallic luster by being subjected to a plating process using a solder or other metal.

The light reflecting part 302 reflecting light from the light emitting device 3 may be formed on the mounting surface 301, on which the light emitting device 3 is mounted, of the first interposer substrate 30 so as to cover most of the mounting surface 301 and be apart from wirings constituting a patterned circuit for supplying power to the light emitting device 3. For example, the light reflecting part 302 may be made of copper foil. The light reflecting part 302 may be made of the same material as the wirings constituting the patterned circuit or may be made of different material. When the light reflecting part 302 is made of the same material as the wirings, the light reflecting part 302 and the wirings can be formed on the first interposer substrate 30 simultaneously.

The light reflecting part 302 may be formed of a solder mask covering the mounting surface 301 of the first interposer substrate 30. The solder mask in a liquid state may be applied on a glass epoxy substrate constituting the first interposer substrate 30, by screen printing, spraying, or curtain coating.

In the optical-coupling semiconductor device 10 of the present embodiment, the light reflecting part 302 of the first interposer substrate 30 is formed by plating with a solder an exposed part of copper foil constituting the wirings. Note that, the way to form the light reflecting part 302 having metallic luster on the first interposer substrate 30 is not limited to plating the copper foil with a solder, but may be plating the copper foil with silver or gold.

The structure of the optical-coupling semiconductor device 10 is not limited to such a structure that the first interposer substrate 30 and the primary support plate 1 are formed as separate parts and the first interposer substrate 30 is fixed on the primary support plate 1 by use of a bond (not shown). In other words, the optical-coupling semiconductor device 10 may include the first interposer substrate 30 and the primary support plate 1 that are formed as a single part.

In the optical-coupling semiconductor device 10 of the present embodiment, it is sufficient that the light emitting device 3 is situated on the primary support plate 1 while the first interposer substrate 30 is between the light emitting device 3 and the primary support plate 1. The structure of the optical-coupling semiconductor device 10 of the present embodiment is not limited to the structure of the optical-coupling semiconductor device 10 illustrated in FIG. 7. Accordingly, the optical-coupling semiconductor device 10 of the present embodiment may appropriately include the structure described in the first embodiment.

Third Embodiment

Figure 8:
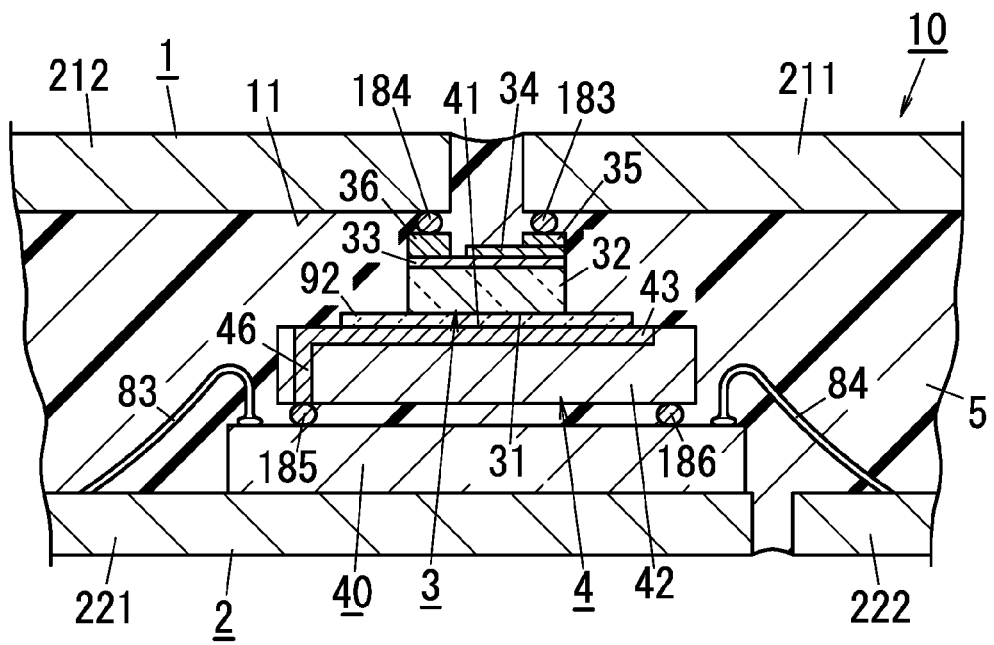
FIG. 8 is a schematic sectional view illustrating the optical-coupling semiconductor device of the third embodiment.

The optical-coupling semiconductor device 10 of the present embodiment shown in FIG. 8 is mainly different from the first embodiment of FIG. 1 in that the light receiving device 4 is situated on the secondary support plate 2 by use of a second interposer substrate 40. Note that, components common to the present embodiment and the first embodiment are designated by the same reference signs and explanations thereof are deemed unnecessary.

As shown in FIG. 8, in the optical-coupling semiconductor device 10 of the present embodiment, the light receiving device 4 is situated on the secondary support plate 2 by situating, on the secondary support plate 2, the second interposer substrate 40 on which the light receiving device 4 is mounted.

In the optical-coupling semiconductor device 10 of the present embodiment, the light receiving device 4 is situated on the secondary support plate 2 while the second interposer substrate 40 is interposed between the light receiving device 4 and the secondary support plate 2. Therefore, the light receiving device 4 having accuracy of form higher than accuracy of form of the secondary support plate 2 can be mounted with high accuracy.

Further, in the optical-coupling semiconductor device 10 of the present embodiment, a difference in linear-expansivity between the second interposer substrate 40 and the light receiving device 4 is smaller than a difference in linear-expansivity between the secondary support plate 2 and the light receiving device 4.

According to the optical-coupling semiconductor device 10, even when the light emitting device 3, the light receiving device 4, the secondary support plate 2, and the second interposer substrate 40 are thermally expanded or contracted due to heat generation in the light emitting device 3, it is possible to reduce stress on electrically bonding parts of the light receiving device 4.

The second interposer substrate 40 used in the optical-coupling semiconductor device 10 of the present embodiment is designed to be interposed between the light receiving device 4 and the secondary support plate 2. The second interposer substrate 40 allows the light receiving device 4 to be mounted on the second interposer substrate 40. The second interposer substrate 40 is allowed to be fixed to the secondary support plate 2. The second interposer substrate 40 may include the wirings (not shown) to be electrically connected to the light receiving device 4. The second interposer substrate 40 allows connecting the secondary support plate 2 to the wirings electrically connected to the light receiving device 4. The second interposer substrate 40 may be made of a glass epoxy resin substrate or a silicon semiconductor substrate, for example.

Figure 9:
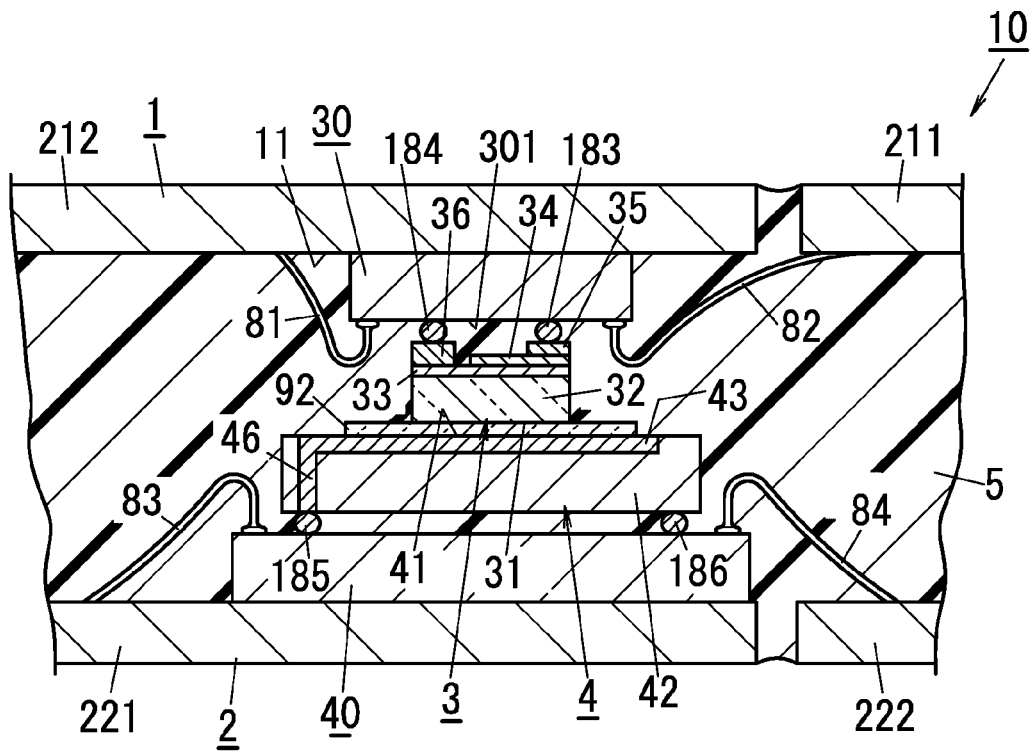
FIG. 9 is a schematic sectional view illustrating the optical-coupling semiconductor device of another example of the third embodiment.

In the optical-coupling semiconductor device 10 of the present embodiment, it is sufficient that the light receiving device 4 is situated on the secondary support plate 2 while the second interposer substrate 40 is between the light receiving device 4 and the secondary support plate 2. The structure of the optical-coupling semiconductor device 10 of the present embodiment is not limited to the structure of the optical-coupling semiconductor device 10 illustrated in FIG. 8. Accordingly, the optical-coupling semiconductor device 10 of the present embodiment may appropriately include the structures of the first embodiment and the second embodiment. For example, the optical-coupling semiconductor device 10 of the present embodiment may include the structure in which the light emitting device 3 is situated on the primary support plate 1 while the first interposer substrate 30 is interposed between the light emitting device 3 and the primary support plate 1 as shown in FIG. 9, in addition to the structure in which the light receiving device 4 is situated on the secondary support plate 2 while the second interposer substrate 40 is interposed between the light receiving device 4 and the secondary support plate 2.

The optical-coupling semiconductor device 10 of the present embodiment may include at least one appropriately selected from the structures of the first embodiment and the second embodiment.

Fourth Embodiment

Figure 10:
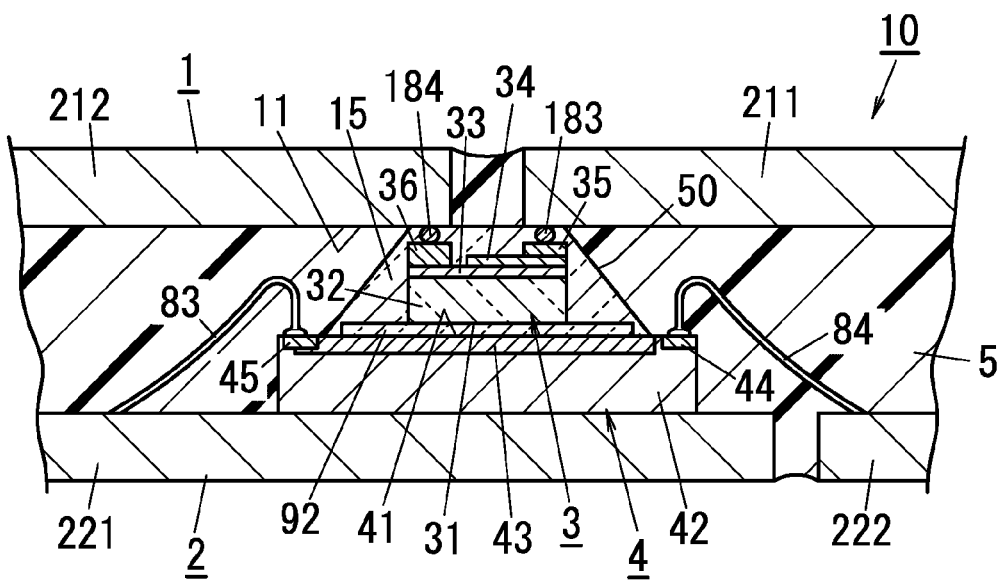
FIG. 10 is a schematic sectional view illustrating the optical-coupling semiconductor device of the fourth embodiment.

The optical-coupling semiconductor device 10 of the present embodiment shown in FIG. 10 is mainly different from the first embodiment of FIG. 1 in that the optical-coupling member 92 is surrounded by the encapsulating member 5 serving as a light reflecting member 50. Note that, components common to the present embodiment and the first embodiment are designated by the same reference signs and explanations thereof are deemed unnecessary.

As shown in FIG. 10, in the optical-coupling semiconductor device 10 of the present embodiment, the optical-coupling member 92 is surrounded by the light reflecting member 50 reflecting light emitted from the light emitting device 3 toward the light receiving device 4.

Consequently, the optical-coupling semiconductor device 10 of the present embodiment can reduce an amount of light from the light emitting device 3 that is not absorbed by the light receiving device 4, and thus the light coupling efficiency between the light emitting device 3 and the light receiving device 4 can be improved.

Further, the optical-coupling semiconductor device 10 of the present embodiment preferably includes a light transmissive member 15 enclosing the optical-coupling member 92. In the optical-coupling semiconductor device 10, the light reflecting member 50 is on an outer surface of the light transmissive member 15. The light transmissive member 15 may be formed of transparent silicone resin, for example. When the optical-coupling semiconductor device 10 is devoid of the light transmissive member 15, the light reflecting member 50 may be in direct contact with an outer surface of the optical-coupling member 92.

The light reflecting member 50 may be made by including particles of silicon oxide or titanium oxide in the encapsulating member 5 of silicone resin, for example. In the optical-coupling semiconductor device 10, the light transmissive member 15 and the light reflecting member 50 are made of the same resin material, but may be made of different resin materials. Further, the light reflecting member 50 may be made by use of the encapsulating member 5, and the light reflecting member 50 and the encapsulating member 5 may be formed as separate parts.

In the optical-coupling semiconductor device 10 of the present embodiment, the light reflecting member 50 reflecting light from the light emitting device 3 toward the light receiving device 4 surrounds the optical-coupling member 92 and thus it is possible to reduce loss caused by light that is emitted from the light emitting device 3 but is not received by the light receiving device 4. Hence, the light coupling efficiency between the light emitting device 3 and the light receiving device 4 can be improved. Consequently, even when the light output of the light emitting device 3 is relatively small, the optical-coupling semiconductor device 10 can transfer light from the light emitting device 3 to the light receiving device 4, and therefore the power consumption of the light emitting device 3 can be reduced.

The optical-coupling semiconductor device 10 of the present embodiment may include at least one appropriately selected from the structures of the first embodiment to the third embodiment.

Fifth Embodiment

The optical-coupling semiconductor device 10 of the present embodiment shown in FIG. 11A and FIG. 11B is mainly different from the first embodiment of FIG. 1 in that the encapsulating member 5 includes at least one of openings (511) individually exposing the primary support plate 1 and the secondary support plate 2. Note that, components common to the present embodiment and the first embodiment are designated by the same reference signs and explanations thereof are deemed unnecessary.

As shown in FIG. 11A and FIG. 11B, the optical-coupling semiconductor device 10 of the present embodiment includes the encapsulating member 5 encapsulating the light emitting device 3 and the light receiving device 4. The encapsulating member 5 includes at least one of openings 511 in respective opposite surfaces of the encapsulating member 5 in a direction in which the light emitting device 3 and the light receiving device 4 face each other. One of the openings 511 exposes an opposite surface of a portion, on which the light emitting device 3 is situated, of the primary support plate 1 from the light emitting device 3, and the other exposes an opposite surface of a portion, on which the light receiving device 4 is situated, of the secondary support plate 2 from the light receiving device 4.

Accordingly, the encapsulating member 5 is made of molding resin to protect the light emitting device 3 and the light receiving device 4. It is sufficient that the encapsulating member 5 encapsulates at least the light emitting device 3 and the light receiving device 4. The encapsulating member 5 is configured to expose at least one of the primary support plate 1 and the secondary support plate 2 through the corresponding opening 511. For example, as shown in FIG. 11B, the encapsulating member 5 includes at least one of openings 511 formed in the opposite surfaces in the direction in which the light emitting device 3 and the light receiving device 4 face each other, that is, the thickness direction of the light emitting device 3 (upward and downward direction in FIG. 11B).

In the example shown in FIG. 11A and FIG. 11B, the opening 511 is formed in a first surface (upper surface in FIG. 11B) 51 of the encapsulating member 5 close to the light emitting device 3 (the primary support plate 1) in the direction in which the light emitting device 3 and the light receiving device 4 face each other. Hereinafter, the opening 511 formed in the first surface 51 is referred to as the first opening 511 if necessary.

The encapsulating member 5 exposes, through the first opening 511, the opposite surface of the portion, on which the light emitting device 3 is situated, of the primary support plate 1 from the light emitting device 3, that is, a rear surface of the portion on which the light emitting device 3 is mounted. In the present embodiment, the opposite surface of the portion, on which the light emitting device 3 is mounted, of the primary support plate 1 is flush with the first surface 51 of the encapsulating member 5. Further, the entire surface of the primary support plate 1 flush with the first surface 51 is exposed via the first opening 511. Therefore, the first opening 511 is formed so as to have an inner shape same as an outer shape of the surface of the primary support plate 1 flush with the first surface 51.

The pair of leads 211 and 212 constituting the primary support plate 1 and the pair of leads 221 and 222 each are bent in the thickness direction inside the encapsulating member 5, and emerge from sides of the encapsulating member 5 at the same position in the direction in which the light emitting device 3 and the light receiving device 4 face each other. Each of the pair of leads 211 and 212 and the pair of leads 221 and 222 has a part emerging from the encapsulating member 5, and this part is bent in the direction in which the light emitting device 3 and the light receiving device 4 face each other so as to be close to the light receiving device 4, and this part has an end serving as a terminal to be connected to a circuit board (not shown) or the like.

Note that, the switching device 203 (see FIG. 2A) is not shown in FIG. 11A and FIG. 11B. As described in the first embodiment, when the optical-coupling semiconductor device 10 is used in a semiconductor relay, appropriate parts such as the switching device 203 are provided. With regard to FIGS. 12 to 15, FIG. 16A, FIG. 16B, FIG. 17A, FIG. 17B, and FIGS. 18 to 22, the switching device 203 is not shown for the same reason.

In the optical-coupling semiconductor device 10 of the present embodiment described above, the encapsulating member 5 includes the opening 511 exposing the opposite surface of the portion, on which the light emitting device 3 is situated, of the primary support plate 1 from the light emitting device 3, and therefore heat generated by the light emitting device 3 can be dissipated efficiently. In summary, instead of covering the primary support plate 1 completely, the encapsulating member 5 includes the opening 511 so that the opposite surface of the portion, on which the light emitting device 3 is situated, of the primary support plate 1 from the light emitting device 3 is exposed. Consequently, heat generated by the light emitting device 3 is transferred to the primary support plate 1 and dissipated outside the encapsulating member 5 through the opening 511, and thus the heat is unlikely to stay inside the encapsulating member 5. As a result, the optical-coupling semiconductor device 10 has the heat dissipation efficiency greater than the heat dissipation efficiency of the structure in which the encapsulating member 5 is devoid of the opening 511, and the improvement of the light emission efficiency can be expected.

FIG. 12 shows the first modification of the present embodiment. In this first modification, the optical-coupling semiconductor device 10 includes a cover member 16 covering a part, exposed via the corresponding opening 511, of the primary support plate 1 and/or a further cover member 16 covering a part, exposed via the corresponding opening, of the secondary support plate 2. The cover member 16 has a thermal emissivity higher than a thermal emissivity of the encapsulating member 5. In summary, in the optical-coupling semiconductor device 10, the opening 511 of the encapsulating member 5 is covered with the cover member 16 having the excellent thermal emissivity. Therefore, in the optical-coupling semiconductor device 10, an amount of heat dissipated through the primary support plate 1 is increased compared with the structure in which the primary support plate 1 is covered with the encapsulating member 5 devoid of the opening 511.

Additionally, in the first modification, it is preferable that the cover member 16 has electrically insulating properties. In other words, it is preferable that the cover member 16 be made of not electrically conductive material but electrically insulating material.

For example, the cover member 16 may be made of ceramic, titanium oxide, or black material such as silicone resin containing black pigment. The cover member 16 is in the form of a thin film, and has a thickness that is sufficiently smaller than a thickness (a dimension in the upward and downward direction in FIG. 12) of the encapsulating member 5 or the primary support plate 1.

The optical-coupling semiconductor device 10 in accordance with the first modification can protect, by use of the cover member 16, the primary support plate 1 from environmental degradation such as oxidation, and can increase the amount of heat dissipated through the primary support plate 1. Therefore, the optical-coupling semiconductor device 10 according to the first modification has the improved heat dissipation efficiency, and thus the improvement of the light emission efficiency can be expected.

Additionally, in the optical-coupling semiconductor device 10 according to the first modification, when the cover member 16 has the electrically insulating properties, the primary support plate 1 that is electrically conductive is covered with the cover member 16, and thus the electrically insulating properties between the pair of leads 211 and 212 and the pair of leads 221 and 222 can be enhanced. In summary, the optical-coupling semiconductor device 10 has a creepage distance between the primary support plate 1 (the pair of leads 211 and 212) and the secondary support plate 2 (the lead 221) on an external surface of the encapsulating member 5 that is longer than that of the optical-coupling semiconductor device 10 devoid of the cover member 16, and therefore the electrically insulating properties can be improved.

Figure 13:
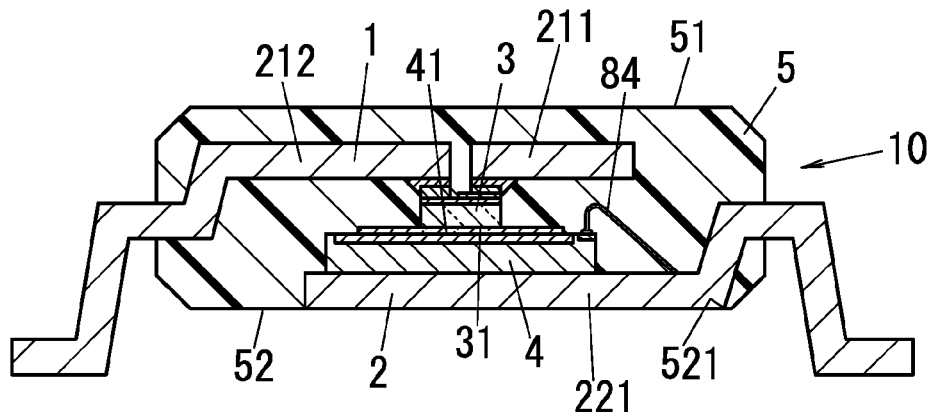
FIG. 13 is an explanatory sectional view illustrating the second modification of the fifth embodiment.

FIG. 13 shows the second modification of the present embodiment. In this second modification, an opening 521 is formed in a second surface (lower surface in FIG. 13) 52 of the encapsulating member 5 close to the light receiving device 4 (the secondary support plate 2) in the direction in which the light emitting device 3 and the light receiving device 4 face each other. Hereinafter, the opening 521 formed in the second surface 52 is referred to as the second opening 521 if necessary.

The encapsulating member 5 exposes, through the second opening 521, the opposite surface of the portion, on which the light receiving device 4 is situated, of the secondary support plate 2 from the light receiving device 4, that is, a rear surface of the portion on which the light receiving device 4 is mounted. In the present modification, the opposite surface of the portion on which the light receiving device 4 is mounted of the secondary support plate 2 is flush with the second surface 52 of the encapsulating member 5. Further, the entire surface of the secondary support plate 2 flush with the second surface 52 is exposed via the second opening 521. Therefore, the second opening 521 is formed so as to have an inner shape same as an outer shape of the surface of the secondary support plate 2 flush with the second surface 52.

In the optical-coupling semiconductor device 10 of the second modification, the encapsulating member 5 includes the opening 521 exposing the opposite surface of the portion, on which the light receiving device 4 is situated, of the secondary support plate 2 from the light receiving device 4, and therefore heat of the light receiving device 4 can be dissipated efficiently. In summary, instead of covering the secondary support plate 2 completely, the encapsulating member 5 includes the opening 521 so that the opposite surface of the portion, on which the light receiving device 4 is situated, of the secondary support plate 2 from the light receiving device 4 is exposed. Consequently, heat occurring in the light receiving device 4 is transferred to the secondary support plate 2 and dissipated outside the encapsulating member 5 through the opening 521, and thus the heat is unlikely to stay inside the encapsulating member 5. As a result, the optical-coupling semiconductor device 10 has the heat dissipation efficiency greater than the heat dissipation efficiency of the structure in which the encapsulating member 5 is devoid of the opening 521, and the improvement of the light receiving efficiency can be expected.

Figure 14:
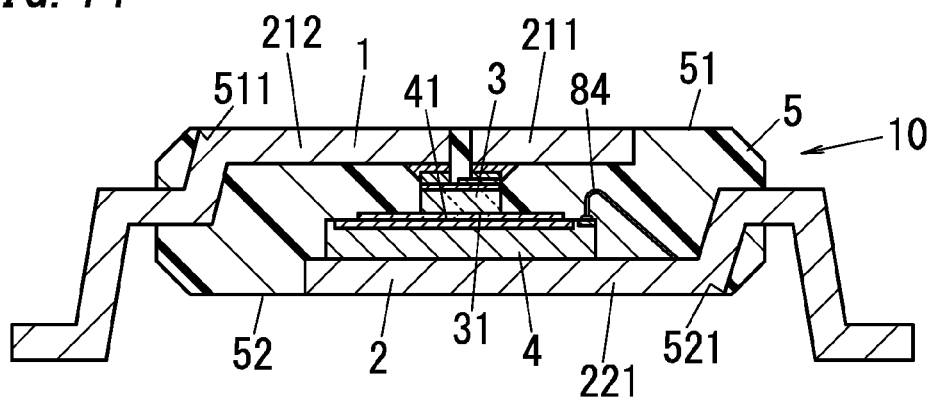
FIG. 14 is an explanatory sectional view illustrating the third modification of the fifth embodiment.

FIG. 14 shows the third modification of the present embodiment. In this third modification, the openings 511 and 512 are provided to the first surface (upper surface in FIG. 14) and the second surface (lower surface in FIG. 14) of the encapsulating member 5, respectively. In brief, the encapsulating member 5 includes the first opening 511 formed in the first surface 51 and the second opening 521 formed in the second surface 52.

The encapsulating member 5 exposes, through the first opening 511, the opposite surface of the portion, on which the light emitting device 3 is situated, of the primary support plate 1 from the light emitting device 3. Additionally, the encapsulating member 5 exposes, through the second opening 521, the opposite surface of the portion, on which the light receiving device 4 is situated, of the secondary support plate 2 from the light receiving device 4.

In the optical-coupling semiconductor device 10 in accordance with the third modification, the encapsulating member 5 exposes the opposite surface of the portion, on which the light emitting device 3 is situated, of the primary support plate 1 from the light emitting device 3 and the opposite surface of the portion, on which the light receiving device 4 is situated, of the secondary support plate 2 from the light receiving device 4. Hence, the optical-coupling semiconductor device 10 can efficiently dissipate heat of the light emitting device 3 and the light receiving device 4. As a result, the optical-coupling semiconductor device 10 has the heat dissipation efficiency greater than the heat dissipation efficiency of the structure in which the encapsulating member 5 is devoid of the openings 511 and 512, and the improvement of the light emission efficiency and the light receiving efficiency can be expected.

Figure 15:
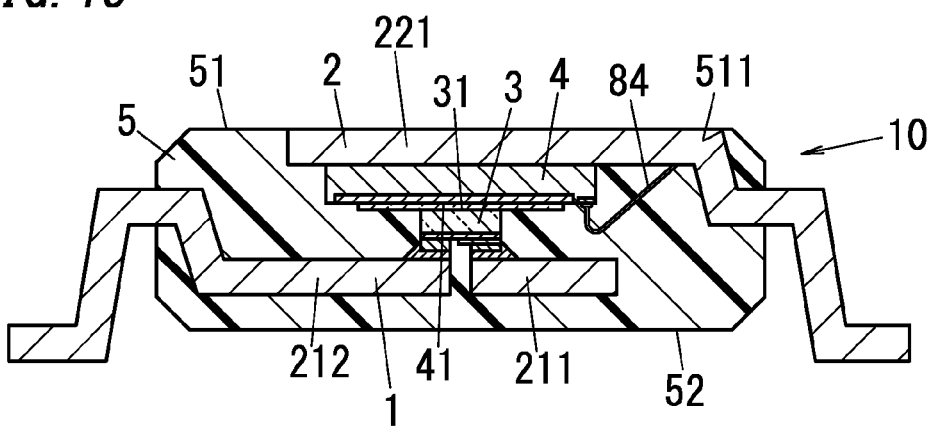
FIG. 15 is an explanatory sectional view illustrating the fourth modification of the fifth embodiment.

FIG. 15 shows the fourth modification of the present embodiment. In this fourth modification, the optical-coupling semiconductor device 10 is configured such that positions of the light emitting device 3 and the light receiving device 4 are switched relative to the example shown in FIG. 11B in the direction in which the light emitting device 3 and the light receiving device 4 face each other. In the fourth modification, the encapsulating member 5 exposes, through the first opening 511 formed in the first surface 51, the opposite surface of the portion, on which the light receiving device 4 is situated, of the secondary support plate 2 from the light receiving device 4.

Note that, the cover member 16 described in the first modification is available for any of the second to fourth modifications. For example, in the second modification, the cover member 16 may be provided to cover the portion of the secondary support plate 2 exposed via the opening 521. In the third modification, the cover member 16 may be provided to cover the portion of the primary support plate 1 exposed via the opening 511 and the further cover member 16 may be provided to cover the portion of the secondary support plate 2 exposed via the opening 521.

Note that, a method of preparing the optical-coupling semiconductor device 10 in accordance with the present embodiment (including the first to fourth modifications) includes a mounting step, a stacking step, and a molding step, as described below. In the mounting step, the light emitting device 3 is situated (mounted) on the primary support plate 1, and the light receiving device 4 is situated (mounted) on the secondary support plate 2. In this step, the light emitting device 3 and the light receiving device 4 are electrically connected to the primary support plate 1 and the secondary support plate 2, respectively. In the subsequent stacking step, the light emitting device 3 and the light receiving device 4 are physically bonded under a condition where the light emitting device 3 and the light receiving device 4 are stacked.

In the subsequent molding step, by use of insert molding, the encapsulating member 5 is formed integrally with the primary support plate 1 and the secondary support plate 2 so that the molding resin encapsulates the light emitting device 3 and the light receiving device 4. In this step, the encapsulating member 5 is formed so as to expose at least one of the opposite surface of the portion, on which the light emitting device 3 is situated, of the primary support plate 1 from the light emitting device 3 and the opposite surface of the portion, on which the light receiving device 4 is situated, of the secondary support plate 2 from the light receiving device 4.

Further, when the optical-coupling semiconductor device 10 includes at least one of the cover member 16 covering the part of the primary support plate 1 exposed via the corresponding opening 511 and the further cover member 16 covering the part of the secondary support plate 2 exposed via the corresponding opening 521 like the first modification, the method of manufacturing the optical-coupling semiconductor device 10 further includes a covering step subsequent to the molding step. In the covering step, the at least one cover member 16 is formed on at least one of the part of the primary support plate 1 exposed via the corresponding opening 511 and the part of the secondary support plate 2 exposed via the corresponding opening 521, by coating, deposition, or the like, for example.

Hence, even when the cover member 16 and the encapsulating member 5 are made of the same material, the cover member 16 can be thinner than the encapsulating member 5 formed by insert molding. Consequently, the optical-coupling semiconductor device 10 can protect, by use of the at least one cover member 16, at least one of the primary support plate 1 and the secondary support plate 2, and can increase the amount of heat dissipated through the at least one of the primary support plate 1 and the secondary support plate 2.

The optical-coupling semiconductor device 10 of the present embodiment (including the first to fourth modifications) may include at least one appropriately selected from the structures of the first to fourth embodiments.

Sixth Embodiment

In the light coupling semiconductor device disclosed in document 1, the light emitting device is situated inside the recess, and the recess is filled with the light transmissive resin and the opaque resin, and thus heat generated by the light emitting device is likely to stay inside the recess. As a result, a temperature of the light emitting device increases, and accordingly the light emission efficiency of the light emitting device decreases. This is likely to cause a decrease in efficiency of transfer of signals from the light emitting device (a primary circuit) to the light receiving device (a secondary circuit).

In view of the above insufficiency, the optical-coupling semiconductor device 10 in accordance with the present embodiment has aimed to improve the efficiency of transfer of signals from the light emitting device to the light receiving device. Note that, components common to the present embodiment and any of the first to fifth embodiments are designated by the same reference signs and explanations thereof are deemed unnecessary.

Figure 16:
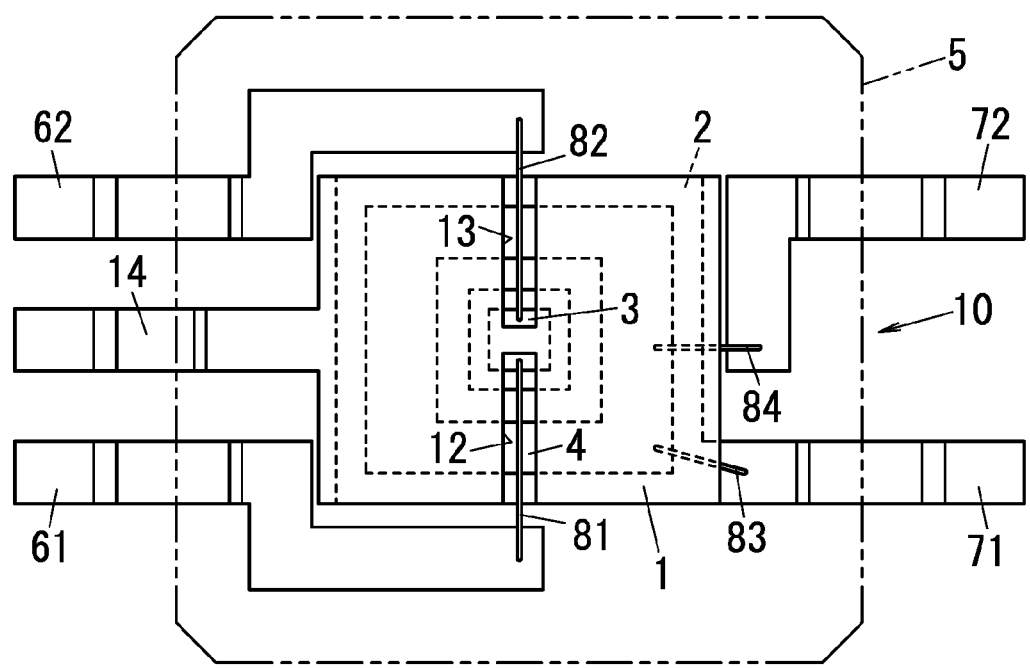
FIG. 16A is a plan view illustrating the optical-coupling semiconductor device of the sixth embodiment.
FIG. 16B is a side view illustrating the optical-coupling semiconductor device of the sixth embodiment.
Figure 16:
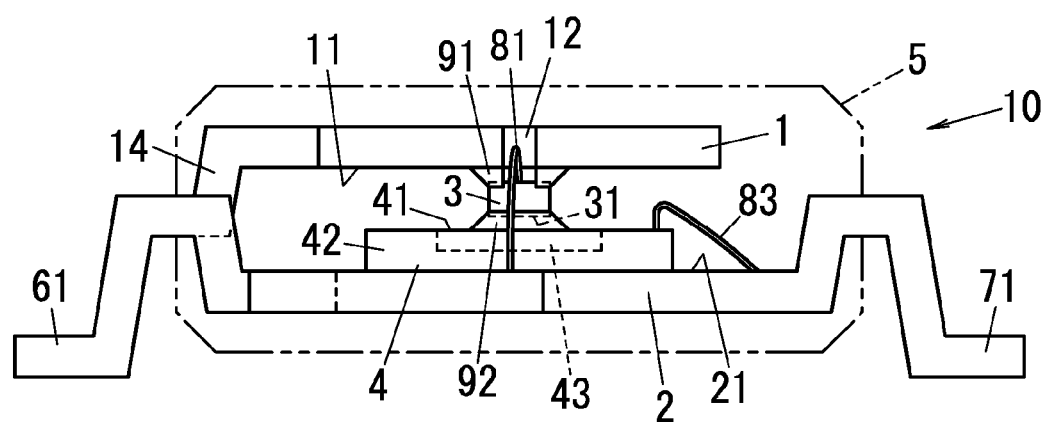

As shown in FIG. 16A and FIG. 16B, the optical-coupling semiconductor device 10 of the present embodiment includes a primary support plate 1 and a secondary support plate 2, a light emitting device 3, a light receiving device 4, an encapsulating member 5, primary electrically conductive plates 61 and 62, and secondary electrically conductive plates 71, and 72.

The primary support plate 1 and the secondary support plate 2 are arranged so as to face each other and be spaced apart a predetermined distance. The light emitting device 3 is situated on the surface facing the secondary support plate 2 of the primary support plate 1 so that a light emitting surface 31 of the light emitting device 3 is oriented (turned, directed) toward the secondary support plate 2 (i.e., the light emitting device 3 faces the secondary support plate 2). The light receiving device 4 is situated on the surface facing the primary support plate 1 of the secondary support plate 2 so that a light receiving surface 41 of the light receiving device 4 faces (i.e., is opposite) the light emitting surface 31 so as to receive light from the light emitting surface 31.

The encapsulating member 5 encapsulates the light emitting device 3 and the light receiving device 4 and further holds the primary support plate 1 and the secondary support plate 2. Each of the primary electrically conductive plates 61 and 62 is electrically connected to the light emitting device 3, and partially emerges from the encapsulating member 5. Each of the secondary electrically conductive plates 71 and 72 is electrically connected to the light receiving device 4, and partially emerges the encapsulating member 5.

In the present embodiment, the secondary support plate 2 is electrically conductive and is formed integrally with the secondary electrically conductive plate 71. In other words, a plate member, which serves as the secondary support plate 2, has electrically conductive properties so as to also serve as the secondary electrically conductive plate 71. The primary support plate 1 has thermally conductive properties and is separate from the primary electrically conductive plates 61 and 62.

In summary, in the optical-coupling semiconductor device 10 of the present embodiment, the secondary support plate 2 to which the light receiving device 4 is attached is not separate from the secondary electrically conductive plates 71 and 72 electrically connected to the light receiving device 4, but is formed integrally with the secondary electrically conductive plate 71. In contrast, the primary support plate 1 to which the light emitting device 3 is attached is separate from the primary electrically conductive plates 61 and 62 electrically connected to the light emitting device 3, and is thermally conductive.

Accordingly, the optical-coupling semiconductor device 10 can dissipate heat generated by the light emitting device 3 through the primary support plate 1 to which the light emitting device 3 is attached. In brief, in the optical-coupling semiconductor device 10, heat of the light emitting device 3 is transferred to the primary support plate 1 and thus it is possible to suppress an increase in temperature of the light emitting device 3. Therefore, a decrease in the light emission efficiency of the light emitting device 3 caused by the increase in the temperature of the light emitting device 3 is unlikely to occur. Consequently, the optical-coupling semiconductor device 10 in accordance with the present embodiment can have the improved efficiency of transfer of signals from the primary circuit electrically connected to the light emitting device 3 to the secondary circuit electrically connected to the light receiving device 4.

Like the optical-coupling semiconductor device 10 of any of the first to fifth embodiments, the optical-coupling semiconductor device 10 in accordance with the present embodiment is available for a semiconductor relay 20 (see FIG. 2A and FIG. 2B), for example. The semiconductor relay 20 includes a switching device 203 in addition to the components of the optical-coupling semiconductor device 10, for example. The switching device 203 may be a MOSFET. In the optical-coupling semiconductor device 10, output of the light receiving device 4 is supplied to the switching device 203, and the switching device 203 is controlled depending on the output of the light receiving device 4. Note that, the switching device 203 may be encapsulated by the encapsulating member 5 of the optical-coupling semiconductor device 10 together with the light emitting device 3 and the light receiving device 4.

While electric power is not supplied to the light emitting device 3, the semiconductor relay 20 keeps turning off the switching device 203. In contrast, when electric power is supplied to the light emitting device 3, a voltage given by a photovoltaic effect of the light receiving device 4 receiving light from the light emitting device 3 is applied to the switching device 203 of the semiconductor relay 20 and then the switching device 203 is turned on.

The semiconductor relay 20 with such a structure can transfer signals from the primary circuit electrically connected to the light emitting device 3 to the secondary circuit electrically connected to the light receiving device 4, while electrically insulating the primary circuit and the secondary circuit from each other.

Hereinafter, the optical-coupling semiconductor device 10 of the present embodiment is described in more detail. Note that, the optical-coupling semiconductor device 10 described below is merely one example of the present invention, and the scope of the present invention is not limited to the following embodiments, and other embodiments, modifications, and variations can be made depending on various applications unless they are deviated from the technical concept of the present invention.

FIG. 16A and FIG. 16B show a schematic structure of the optical-coupling semiconductor device 10 in accordance with the present embodiment. However, for the purpose of showing a structure inside the encapsulating member 5, the encapsulating member 5 is illustrated by only a visible outline of the encapsulating member 5 that is indicated by an imaginary line (tow-dot chain line). Note that, the following explanation is made under a condition where an upward and downward direction in FIG. 16A is corresponding to a width direction of the optical-coupling semiconductor device 10, and upward, downward, left, and right directions in FIG. 16B are corresponding to upward, downward, left, and right directions of the optical-coupling semiconductor device 10, respectively. There is no intent to limit, by these directions, a direction in which the optical-coupling semiconductor device 10 is used.

The primary support plate 1 and the secondary support plate 2 are arranged so that main surfaces of the primary support plate 1 and the secondary support plate 2 face each other in the upward and downward direction. In the example of FIG. 16A and FIG. 16B, the primary support plate 1 and the secondary support plate 2 are arranged in substantially parallel to each other so that the primary support plate 1 is positioned above the secondary support plate 2. Consequently, a lower surface of the primary support plate 1 and an upper surface of the secondary support plate 2 face each other and are spaced apart a predetermined distance.

The primary support plate 1 includes a surface (lower surface in this embodiment) opposite the secondary support plate 2, and this surface is used as a (first) mounting surface 11 to which the light emitting device 3 is attached. The secondary support plate 2 includes a surface (upper surface in this embodiment) opposite the primary support plate 1, and this surface is used as a (second) mounting surface 21 to which the light receiving device 4 is attached. The secondary support plate 2 is formed integrally with the first secondary electrically conductive plate 71, but this structure is described in detail below.

In the present embodiment, each of the primary support plate 1 and the secondary support plate 2 is of a metal plate having a square-like shape. The light emitting device 3 is attached to a vicinity of a center of the mounting surface 11 of the primary support plate 1. Slits 12 and 13 are formed in a vicinity of a center of the primary support plate 1 in the left and right directions, and respectively extend to opposite ends of the primary support plate 1 in the width direction. The pair of slits 12 and 13 are provided to avoid undesired contact between the primary support plate 1 and a pair of bonding wires 81 and 82 electrically connecting the primary electrically conductive plates 61 and 62 to the light emitting device 3, respectively. Note that, the aforementioned shape of each of the primary support plate 1 and the secondary support plate 2 is one example, and the shape of each of the primary support plate 1 and the secondary support plate 2 is not limited to a square-like shape.

The light emitting device 3 is a device for converting an inputted electric signal into light. In the present embodiment, the light emitting device 3 is a light emitting diode. The light emitting device 3 has a structure in which a light emitting unit (not shown) including an n-type semiconductor layer and a p-type semiconductor layer is formed on a light transmissive substrate (not shown) having light transmissive properties so that light produced by the light emitting unit is emitted outside through the light transmissive substrate. The light emitting device 3 is attached to the mounting surface (lower surface) 11 of the primary support plate 1 so that the light emitting surface 31 faces the secondary support plate 2. The light emitting surface 31 is one surface, from which light emerges, of the light emitting device 3. For example, when the light emitting unit is formed on an upper surface of the light transmissive substrate, the light emitting surface 31 is an opposite surface (lower surface) of the light transmissive substrate from the light emitting unit.

The light emitting device 3 is physically coupled (e.g., bonded) to the mounting surface 11 of the primary support plate 1 by a coupling member 91 under a condition where an opposite surface (upper surface) of the light emitting device 3 from the light emitting surface 31 faces the primary support plate 1. The coupling member 91 is preferably of electrically insulating material such as synthetic resin (e.g., epoxy resin and acrylic resin). In this case, the light emitting device 3 is mounted (situated) on the primary support plate 1 while the electrically insulating material is between the light emitting device 3 and the primary support plate 1, and is supported by the primary support plate 1. Accordingly, the light emitting device 3 can be electrically insulated from the primary support plate 1. However, the minimum requirement for the coupling member 91 is that the coupling member 91 can fix the light emitting device 3 to the mounting surface 11, and hence the coupling member 91 may be of electrically conductive material such as electrically conductive paste.

The light receiving device 4 is a device for receiving light from the light emitting device 3 and converting the received light into an electric signal. In the present embodiment, the light receiving device 4 is a photodiode. The light receiving device 4 may be a phototransistor, a solar cell, or the like. For example, the light receiving device 4 has a structure in which a p-type region 43 is formed in an n-type silicon substrate 42. The light receiving device 4 is attached to the mounting surface (upper surface) 21 of the secondary support plate 2 so that the light receiving surface 41 faces the light emitting surface 31. The light receiving surface 41 is one surface, to receive light, of the light receiving device 4. In the example shown in FIG. 16A and FIG. 16B, the light receiving surface 41 is an opposite surface (upper surface) of the p-type region 43 of the n-type silicon substrate 42 from the secondary support plate 2.

The light receiving device 4 is physically coupled (e.g., bonded) to the mounting surface 21 of the secondary support plate 2 by a coupling member (not shown) under a condition where an opposite surface (upper surface) of the light receiving device 4 from the light receiving surface 41 faces the secondary support plate 2. Consequently, the light receiving device 4 is mounted (situated) on the secondary support plate 2, and is supported by the secondary support plate 2. The minimum requirement for the coupling member is that the coupling member can fix the light receiving device 4 to the mounting surface 21, and hence the coupling member may be of electrically insulating material such as synthetic resin (e.g., epoxy resin and acrylic resin), or electrically conductive material such as electrically conductive paste.

In the present embodiment, the light emitting device 3 is placed on the light receiving surface 41 of the light receiving device 4. In other words, the light emitting device 3 is supported on the light receiving device 4 so that the light emitting surface 31 and the light receiving surface 41 face each other without leaving a substantial gap between the light emitting device 3 and the light receiving device 4.

In the present embodiment, the light emitting device 3 is placed on the light receiving surface 41 while an optical-coupling member 92 having electrically insulating properties and light transmissive properties is interposed between the light emitting device 3 and the light receiving surface 41 (i.e., the light emitting device 3, the optical-coupling member 92, and the light receiving device 4 are stacked). In short, the light emitting device 3 is on the light receiving surface 41 of the light receiving device 4. The optical-coupling member 92 can suppress multiple reflection caused by reflection at the light emitting surface 31 of the light emitting device 3, and thus an amount of light emerging from the light emitting device 3 can be increased. Additionally, the optical-coupling member 92 preferably is thermally conductive. In this case, the optical-coupling semiconductor device 10 can transfer heat generated by the light emitting device 3 to the secondary support plate 2 through the optical-coupling member 92 and the light receiving device 4. Note that, the optical-coupling member 92 is optional, and therefore the light emitting device 3 may be placed directly on the light receiving surface 41 of the light receiving device 4.

The encapsulating member 5 is made of molding resin to protect the light emitting device 3 and the light receiving device 4 from external shocks, external light, and the like. In the present embodiment, the encapsulating member 5 encapsulates the primary support plate 1 and the secondary support plate 2, the light emitting device 3, the light receiving device 4, and the primary electrically conductive plates 61 and 62 and the secondary electrically conductive plates 71 and 72 except for parts of the primary electrically conductive plates 61 and 62 and the secondary electrically conductive plates 71 and 72. However, it is sufficient that the encapsulating member 5 encapsulates at least the light emitting device 3 and the light receiving device 4, and there is no need that the encapsulating member 5 encapsulates the whole of these components. The encapsulating member 5 may be of electrically insulating material such as epoxy resin containing black pigment, for example.

Further, as shown in FIG. 16A and FIG. 16B, the optical-coupling semiconductor device 10 of the present embodiment includes the pair of primary electrically conductive plates 61 and 62 defining a first primary electrically conductive plate 61 and a second primary electrically conductive plate 62. Similarly, the optical-coupling semiconductor device 10 includes the pair of secondary electrically conductive plates 71 and 72 defining a first secondary electrically conductive plate 71 and a second secondary electrically conductive plate 72.

Each of the primary electrically conductive plates 61 and 62 and the secondary electrically conductive plates 71 and 72 is an electrically conductive lead frame that has one end in a lengthwise direction embedded in the encapsulating member 5 and the other end emerging from the encapsulating member 5 leftward or rightward. In the example shown in FIG. 16A and FIG. 16B, each of the primary electrically conductive plates 61 and 62 has a right end embedded in the encapsulating member 5, and a left end emerging leftward from the encapsulating member 5. Each of the secondary electrically conductive plates 71 and 72 has a left end embedded in the encapsulating member 5, and a right end emerging rightward from the encapsulating member 5.

Each of the pair of primary electrically conductive plates 61 and 62 and the pair of secondary electrically conductive plates 71 and 72 emerges laterally from a vicinity of a center of the encapsulating member 5 in the upward and downward direction, and is bent downward, and is bent in an opposite direction from the encapsulating member 5. Consequently, the pair of primary electrically conductive plates 61 and 62 and the pair of secondary electrically conductive plates 71 and 72 have ends outside the encapsulating member 5 that are positioned in the same imaginary plane.

Additionally, each of the pair of primary electrically conductive plates 61 and 62 and the pair of secondary electrically conductive plates 71 and 72 is inserted in the encapsulating member 5 through the vicinity of the center of the encapsulating member 5 in the upward and downward direction, and is bent downward, and is bent toward the center of the encapsulating member 5 in the left and right direction. Consequently, the pair of primary electrically conductive plates 61 and 62 and the pair of secondary electrically conductive plates 71 and 72 have further ends inside the encapsulating member 5 that are positioned together with the secondary support plate 2 in the same imaginary plane.

Further, in a plan view, as shown in FIG. 16A, the first primary electrically conductive plate 61 and the second primary electrically conductive plate 62 each are bent in a crank shape so that an interval between right ends of the first primary electrically conductive plate 61 and the second primary electrically conductive plate 62 in the width direction is greater than an interval between left ends of the first primary electrically conductive plate 61 and the second primary electrically conductive plate 62 in the width direction. Thus, the secondary support plate 2 is positioned between the right ends of the pair of primary electrically conductive plates 61 and 62.

Further, the first secondary electrically conductive plate 71 has the left end that is positioned inside the encapsulating member 5 and is connected to the secondary support plate 2. The second secondary electrically conductive plate has a part positioned inside the encapsulating member 5 and this part is bent toward the first secondary electrically conductive plate 71.

In the present embodiment, the secondary support plate 2 and the first secondary electrically conductive plate 71 are provided as a single part formed of the same lead frame. Hence, the secondary support plate 2 is of electrically conductive material. In other words, the lead frame for constituting the secondary electrically conductive plate 71 has a part constituting the secondary support plate 2 to which the light receiving device 4 is attached. Alternatively, the secondary support plate 2 may be formed integrally with not the first secondary electrically conductive plate 71 but the second secondary electrically conductive plate 72.

Note that, in the present embodiment, the primary support plate 1 is also constituted by electrically conductive material (lead frame). However, it is optional that the primary support plate 1 is electrically conductive. For example, the primary support plate 1 may be of an insulating substrate such as a glass epoxy substrate and a ceramic substrate. The primary support plate 1 is not limited to the above instances, but may be of any electrically conductive material or any electrically insulating material. When the primary support plate 1 is of electrically conductive material, it is preferable that a surface of the primary support plate 1 be covered with a member such as an electrically insulating coating. In the optical-coupling semiconductor device 10 according to this configuration, it is possible to improve the electrically insulating properties between the primary support plate 1 and an electrically conductive member (e.g., the primary electrically conductive plates 61 and 62) different from the primary support plate 1.

The light emitting device 3 includes a pair of electrodes (not shown), and one of the pair of electrodes is electrically connected to the first primary electrically conductive plate 61 through the bonding wire 81, and the other of the pair of electrodes is electrically connected to the second primary electrically conductive plate 62 through the bonding wire 82. The light receiving device 4 includes a pair of electrodes (not shown), and one of the pair of electrodes is electrically connected to the first secondary electrically conductive plate 71 through a bonding wire 83, and the other of the pair of electrodes is electrically connected to the second secondary electrically conductive plate 72 through a bonding wire 84. Note that, the pair of slits 12 and 13 are provided to the primary support plate 1, and therefore undesired contact between the primary support plate 1 and the pair of bonding wires 81 and 82 connected to the light emitting device 3 can be avoided.

Additionally, the optical-coupling semiconductor device 10 in accordance with the present embodiment includes a connection plate 14. The connection plate 14 is to electrically connect the primary support plate 1 to a circuit ground of the primary circuit to be electrically connected to the light emitting device 3. As shown in FIGS. 16A and 16B, the connection plate 14 is formed integrally with the primary support plate 1 so that the connection plate 14 extends leftward from a center in the width direction of a left end of the primary support plate 1.

The connection plate 14 is formed such that the connection plate 14 extends leftward from the primary support plate 1, and is bent downward, and is bent leftward, and emerges from the encapsulating member 5, and thus the connection plate 14. In the outside of the encapsulating member 5, the connection plate 14 emerges leftward from a vicinity of a center of the encapsulating member 5 in the upward and downward direction, and is bent downward, and is bent leftward. Consequently, the connection plate 14 has a left end positioned, in the same imaginary plane, together with the ends, which emerge from the encapsulating member 5, of the pair of primary electrically conductive plates 61 and 62 and the pair of secondary electrically conductive plates 71 and 72.

According to the optical-coupling semiconductor device 10 of the present embodiment described above, the primary support plate 1 is thermally conductive and is separate from the primary electrically conductive plates 61 and 62. Therefore, the optical-coupling semiconductor device 10 can transfer (dissipate) heat generated by the light emitting device 3 to the outside through the primary support plate 1 to which the light emitting device 3 is attached. In other words, in the optical-coupling semiconductor device 10, the light emitting device 3 is attached to the primary support plate 1 having thermally conductive properties, and thus a heat capacity of the light emitting device 3 can be treated as being increased.

Consequently, in the optical-coupling semiconductor device 10, the heat dissipation efficiency of the light emitting device 3 is improved and the increase in the temperature of the light emitting device 3 can be suppressed, and thus a decrease in the light emission efficiency caused by the increase in the temperature is unlikely to occur. As a result, the optical-coupling semiconductor device 10 in accordance with the present embodiment can have the improved efficiency of transfer of signals from the primary circuit electrically connected to the light emitting device 3 to the secondary circuit electrically connected to the light receiving device 4.

Additionally, the primary support plate 1 is a separate part from the primary electrically conductive plates 61 and 62 electrically connected to the light emitting device 3. Hence, even when the primary support plate 1 is partially exposed on the encapsulating member 5, it is possible to improve the electrically insulating properties between the primary circuit and the secondary circuit. In other words, even when the primary support plate 1 is partially exposed on the encapsulating member 5, the optical-coupling semiconductor device 10 can have relatively long creepage distances between the primary electrically conductive plates 61 and 62 and the secondary electrically conductive plates 71 and 72 on the external surface of the encapsulating member 5, and therefore the electrically insulating properties can be improved.

Moreover, the primary support plate 1 is a separate part from the primary electrically conductive plates 61 and 62 electrically connected to the light emitting device 3, and hence it is possible to electrically connect the primary support plate 1 to the circuit ground of the primary circuit by use of the connection plate 14 like the present embodiment. According to this configuration, the optical-coupling semiconductor device 10 can transfer (dissipate) heat to a patterned conductor of the circuit ground of the primary circuit from the primary support plate 1 through the connection plate 14. As a result, the heat dissipation efficiency of the light emitting device 3 of the optical-coupling semiconductor device 10 in accordance with the present embodiment is more increased relative to the structure devoid of the connection plate 14, and the decrease in the light emission efficiency of the light emitting device 3 caused by an increase in the temperature is more unlikely to occur. Therefore, in this optical-coupling semiconductor device 10, the improvement of the light emission efficiency of the light emitting device 3 can be expected.

Further, in the optical-coupling semiconductor device 10 according to the present structure, the primary support plate 1 is electrically connected to the circuit ground of the primary circuit, and the circuit ground has a base potential. Therefore, the primary support plate 1 can function as an electromagnetic shield. In short, the primary support plate 1 serves as the electromagnetic shield and thus it is possible to suppress undesired effects on the light emitting device 3 and the light receiving device 4 caused by noises. Note that, the primary support plate 1 is electrically connected to not the secondary circuit but the primary circuit, and hence the electrically insulating properties between the light emitting device 3 and the secondary circuit do not become poor.

Further, like the present embodiment, the light emitting device 3 is preferably placed on the light receiving surface 41 of the light receiving device 4. The optical-coupling semiconductor device 10 according to this configuration is shorter in a distance between the light emitting device 3 and the light receiving device 4 than a comparative example in which the light emitting device 3 and the light receiving device 4 are spaced apart an interval. Thus, the efficiency of optical-coupling between the light emitting device 3 and the light receiving device 4 is improved. In other words, the light receiving device 4 can receive light from the light emitting device 3 efficiently. Additionally, in the optical-coupling semiconductor device 10 according to this configuration, it is possible to precisely adjust the distance between the light emitting device 3 and the light receiving device 4 to a desired distance, and therefore the efficiency of optical-coupling between the light emitting device 3 and the light receiving device 4 becomes more stable.

Figure 17:
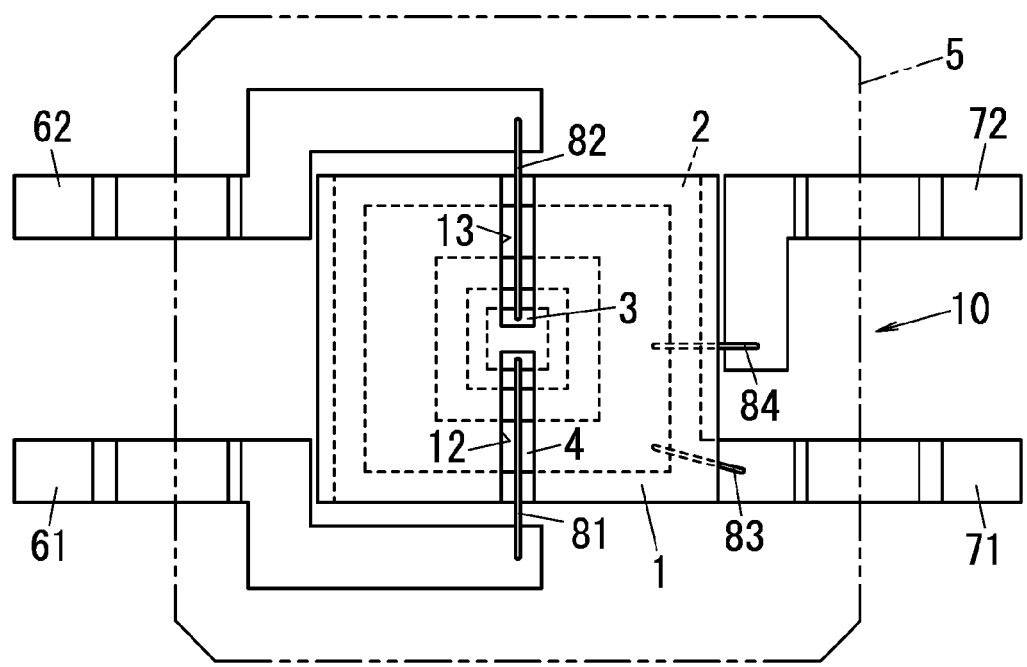
FIG. 17A is a plan view illustrating the optical-coupling semiconductor device according to the first modification of the sixth embodiment.
FIG. 17B is a side view illustrating the optical-coupling semiconductor device according to the first modification of the sixth embodiment.

FIG. 17A and FIG. 17B show the first modification of the present embodiment. In this first modification, the optical-coupling semiconductor device 10 is devoid of the connection plate 14 (see FIG. 16A) that is to connect the primary support plate 1 to the circuit ground.

Figure 18:
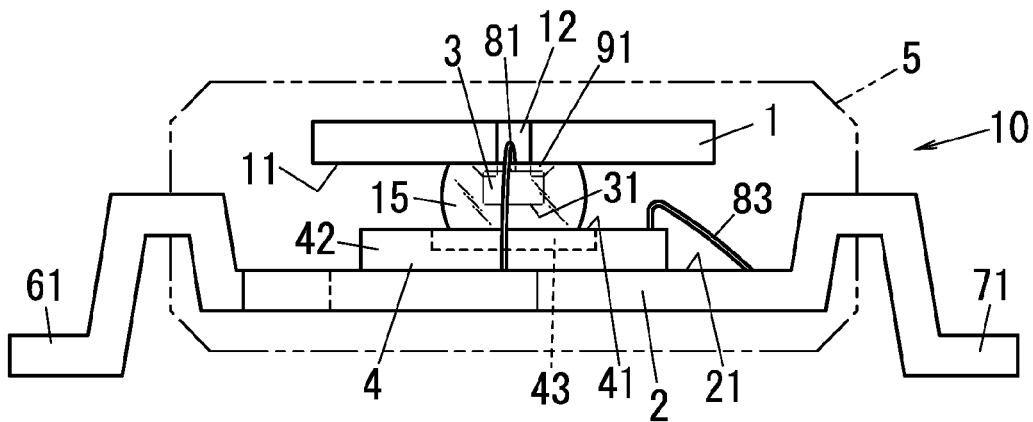
FIG. 18 is a side view illustrating the optical-coupling semiconductor device according to the second modification of the sixth embodiment.

FIG. 18 shows the second modification of the present embodiment. In this second modification, the optical-coupling semiconductor device 10 is configured such that the light emitting surface 31 of the light emitting device 3 and the light receiving surface 41 of the light receiving device 4 face each other and are spaced apart a predetermined interval. In short, the light emitting device 3 is not placed on the light receiving surface 41 of the light receiving device 4, but is positioned away from the light receiving device 4 so that the light emitting surface 31 faces the light receiving surface 41. In the optical-coupling semiconductor device 10 according to the second modification, it is preferable that at least a space between the light emitting surface 31 and the light receiving surface 41 is filled with a light transmissive member 15 of synthetic resin having electrically insulating properties and light transmissive properties.

Seventh Embodiment

Figure 19:
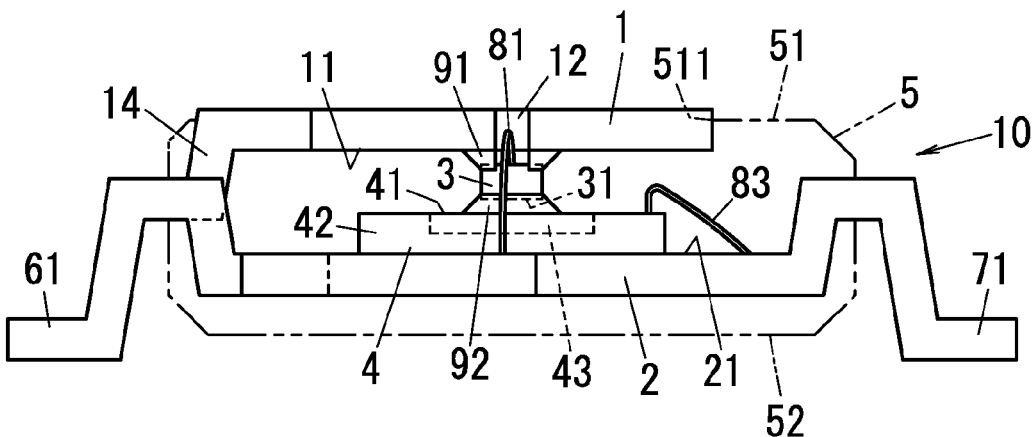
FIG. 19 is a side view illustrating the optical-coupling semiconductor device of the seventh embodiment.

As shown in FIG. 19, the optical-coupling semiconductor device 10 of the present embodiment is mainly different from the structure (see FIG. 16B) according to the sixth embodiment in that the encapsulating member 5 includes an opening 511 and exposes the primary support plate 1 via the opening 511. Note that, components common to the present embodiment and the sixth embodiment are designated by the same reference signs and explanations thereof are deemed unnecessary.

In the present embodiment, as shown in FIG. 19, the encapsulating member 5 includes a first surface 51 and the (first) opening 511. The first surface 51 is one of opposite surfaces of the encapsulating member 5 in the direction (upward and downward direction) in which the primary support plate 1 and the secondary support plate 2 face each other and is close to the primary support plate 1. The first opening 511 is formed in the first surface 51. In this optical-coupling semiconductor device 10, an opposite surface (upper surface) of a portion, to which the light emitting device 3 is attached, of the primary support plate 1 from the light emitting device 3 includes a face of the primary support plate 1 exposed via the opening 511.

Accordingly, the encapsulating member 5 is made of molding resin to protect the light emitting device 3 and the light receiving device 4. It is sufficient that the encapsulating member 5 encapsulates at least the light emitting device 3 and the light receiving device 4. In the present embodiment, the encapsulating member 5 exposes part of the primary support plate 1 via the opening 511.

The encapsulating member 5 exposes, through the opening 511, the opposite surface of the portion, on which the light emitting device 3 is situated, of the primary support plate 1 from the light emitting device 3, that is, a rear surface of the portion on which the light emitting device 3 is mounted. In the present embodiment, the primary support plate 1 protrudes upward from the first surface 51 of the primary support plate 1. In brief, the opposite surface of the portion on which the light emitting device 3 is mounted of the primary support plate 1 is positioned above the first surface 51 of the encapsulating member 5.

In the optical-coupling semiconductor device 10 of the present embodiment described above, the encapsulating member 5 includes the opening 511 exposing the opposite surface of the portion, on which the light emitting device 3 is situated, of the primary support plate 1 from the light emitting device 3, and therefore heat generated by the light emitting device 3 can be dissipated efficiently. In summary, the encapsulating member 5 does not cover the primary support plate 1 completely, but includes the opening 511 so that the opposite surface of the portion, on which the light emitting device 3 is situated, of the primary support plate 1 from the light emitting device 3 is exposed. Consequently, heat generated by the light emitting device 3 is transferred to the primary support plate 1 and dissipated outside the encapsulating member 5 through the opening 511, and thus the heat is unlikely to stay inside the encapsulating member 5. As a result, the optical-coupling semiconductor device 10 has the heat dissipation efficiency greater than the heat dissipation efficiency of the structure in which the encapsulating member 5 is devoid of the opening 511, and the improvement of the light emission efficiency can be expected.

Figure 20:
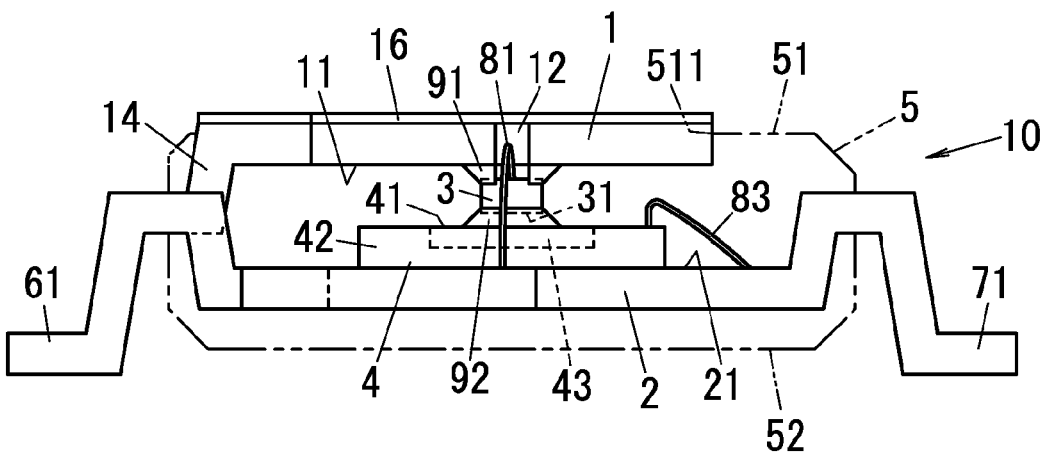
FIG. 20 is a side view illustrating the optical-coupling semiconductor device according to the first modification of the seventh embodiment.

FIG. 20 shows the first modification of the present embodiment. In this first modification, the optical-coupling semiconductor device 10 includes a cover member 16 covering a part, exposed via the opening 511, of the primary support plate 1. The cover member 16 has a thermal emissivity higher than a thermal emissivity of the encapsulating member 5. In summary, in the optical-coupling semiconductor device 10, the opening 511 of the encapsulating member 5 is covered with the cover member 16 having the excellent thermal emissivity.

Therefore, in the optical-coupling semiconductor device 10, an amount of heat dissipated through the primary support plate 1 is increased compared with the structure in which the primary support plate 1 is covered with the encapsulating member 5 devoid of the opening 511.

Additionally, in the first modification, it is preferable that the cover member 16 has electrically insulating properties. In other words, it is preferable that the cover member 16 is made of not electrically conductive material but electrically insulating material.

For example, the cover member 16 may be made of ceramic, titanium oxide, or black material such as silicone resin containing black pigment. The cover member 16 is in the form of a thin film, and has a thickness that is sufficiently smaller than a thickness (a dimension in the upward and downward direction in FIG. 20) of the encapsulating member 5 or the primary support plate 1.

The optical-coupling semiconductor device 10 in accordance with the first modification can protect, by use of the cover member 16, the primary support plate 1 from environmental degradation such as oxidation, and can increase the amount of heat dissipated through the primary support plate 1. Therefore, the optical-coupling semiconductor device 10 according to the first modification has the improved heat dissipation efficiency, and thus the improvement of the light emission efficiency can be expected.

Figure 21:
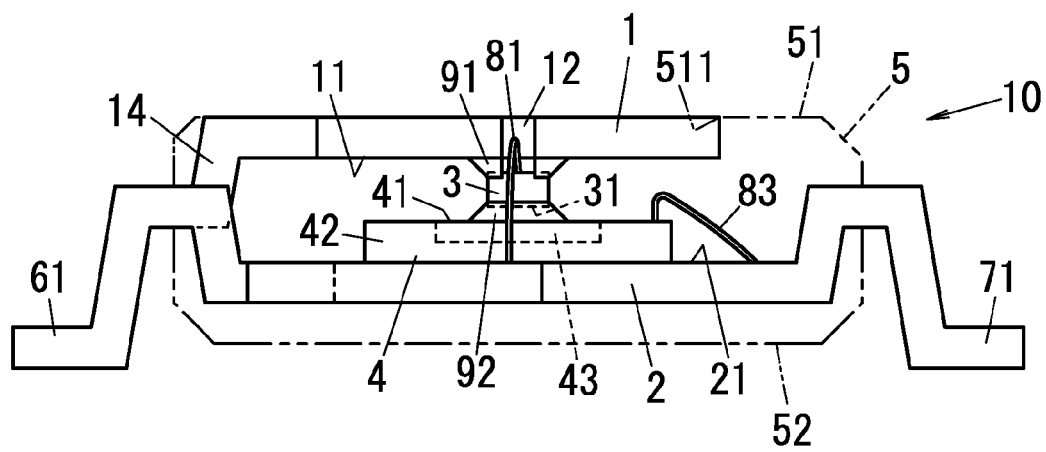
FIG. 21 is a side view illustrating the optical-coupling semiconductor device according to the second modification of the seventh embodiment.

FIG. 21 shows the second modification of the present embodiment. In the second modification, the encapsulating member 5 is formed so that a vicinity of the opening 511 of the first surface 51 is flush with the face of the primary support plate 1 exposed via the opening 511. Further, the entire surface of the primary support plate 1 flush with the first surface 51 is exposed via the opening 511. Therefore, the opening 511 is formed to have an inner shape same as an outer shape of the surface of the primary support plate 1 flush with the first surface 51.

According to the second modification, when the encapsulating member 5 and the primary support plate 1 are formed integrally by insert molding, there is an advantage that formation of the opening 511 for exposing the primary support plate 1 can be facilitated.

Figure 22:
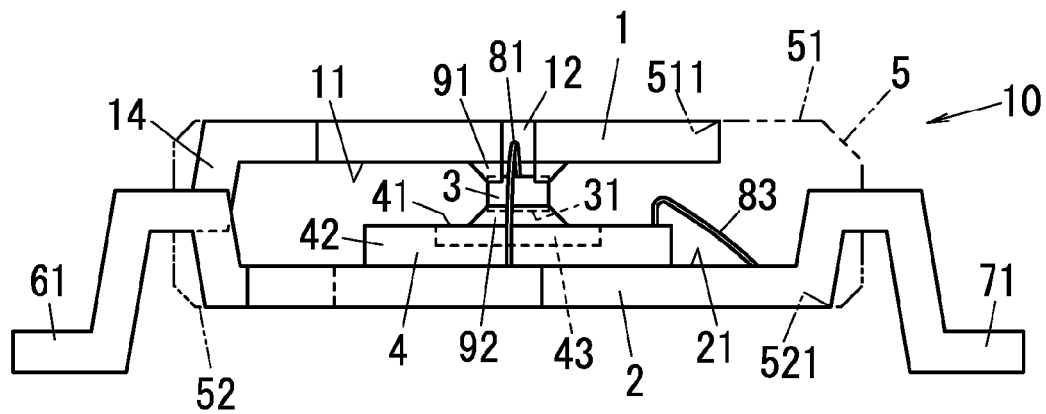
FIG. 22 is a side view illustrating the optical-coupling semiconductor device according to the third modification of the seventh embodiment.

FIG. 22 shows the third modification of the present embodiment. In this third modification, the encapsulating member 5 includes a second surface 52 (lower surface in FIG. 22) and the (second) opening 521. The second surface 52 is one of the opposite surfaces of the encapsulating member 5 in the direction (upward and downward direction) in which the primary support plate 1 and the secondary support plate 2 face each other and is close to the secondary support plate 2. The second opening 521 is formed in the second surface 52. In brief, in the third modification, the encapsulating member 5 includes the first opening 511 formed in the first surface 51 and the second opening 521 formed in the second surface 52.

The encapsulating member 5 exposes, through the first opening 511, the opposite surface of the portion, on which the light emitting device 3 is situated, of the primary support plate 1 from the light emitting device 3. Additionally, the encapsulating member 5 exposes, through the second opening 521, the opposite surface of the portion, on which the light receiving device 4 is situated, of the secondary support plate 2 from the light receiving device 4.

In the present modification, like the second modification, the encapsulating member 5 is formed so that the vicinity of the opening 511 of the first surface 51 is flush with the face of the primary support plate 1 exposed via the opening 511. Additionally, the encapsulating member 5 is formed so that a vicinity of the opening 521 of the second surface 52 is flush with the face of the secondary support plate 2 exposed via the opening 521. Further, the entire surface of the secondary support plate 2 flush with the second surface 52 is exposed via the second opening 521. Therefore, the second opening 521 is formed to have an inner shape same as an outer shape of the surface of the secondary support plate 2 flush with the second surface 52.

In the optical-coupling semiconductor device 10 in accordance with the third modification, the encapsulating member 5 exposes the opposite surface of the portion, on which the light emitting device 3 is situated, of the primary support plate 1 from the light emitting device 3 and the opposite surface of the portion, on which the light receiving device 4 is situated, of the secondary support plate 2 from the light receiving device 4. Hence, the optical-coupling semiconductor device 10 can efficiently dissipate heat of the light emitting device 3 and the light receiving device 4. As a result, the optical-coupling semiconductor device 10 has the heat dissipation efficiency greater than the heat dissipation efficiency of the structure in which the encapsulating member 5 is devoid of the openings 511 and 512, and the improvement of the light emission efficiency and the light receiving efficiency can be expected.

Note that, the cover member 16 described in the first modification is available for any of the second and third modifications. For example, in the third modification, the cover member 16 may be provided to cover the portion of the primary support plate 1 exposed via the opening 511 and the further cover member 16 may be provided to cover the portion of the secondary support plate 2 exposed via the opening 521.

Note that, a method of preparing the optical-coupling semiconductor device 10 in accordance with the present embodiment (including the first to third modifications) includes a mounting step, a stacking step, and a molding step, as described below. In the mounting step, the light emitting device 3 is situated (mounted) on the primary support plate 1, and the light receiving device 4 is situated (mounted) on the secondary support plate 2. In this step, the light emitting device 3 is electrically connected to the pair of primary electrically conductive plates 61 and 62, and the light receiving device 4 is electrically connected to the pair of secondary electrically conductive plates 71 and 72. In the subsequent stacking step, the light emitting device 3 and the light receiving device 4 are physically bonded under a condition where the light emitting device 3 is placed on the light receiving device 4.

In the subsequent molding step, by use of insert molding, the encapsulating member 5 is formed integrally with the primary support plate 1 and the secondary support plate 2 so that the molding resin encapsulates the light emitting device 3 and the light receiving device 4. In this step, the encapsulating member 5 is formed so as to expose at least one of the opposite surface of the portion, on which the light emitting device 3 is situated, of the primary support plate 1 from the light emitting device 3 and the opposite surface of the portion, on which the light receiving device 4 is situated, of the secondary support plate 2 from the light receiving device 4.

Further, when the optical-coupling semiconductor device 10 includes the cover member 16 covering the part of the primary support plate 1 exposed via the opening 511 like the first modification, the method of manufacturing the optical-coupling semiconductor device 10 further includes a covering step subsequent to the molding step. In the covering step, the cover member 16 is formed on the part of the primary support plate 1 exposed via the opening 511, by coating, deposition, or the like, for example.

Hence, even when the cover member 16 and the encapsulating member 5 are made of the same material, the cover member 16 can be thinner than the encapsulating member 5 formed by insert molding. Consequently, the optical-coupling semiconductor device 10 can protect the primary support plate 1 by use of the cover member 16, and can increase the amount of heat dissipated through the primary support plate 1.

The optical-coupling semiconductor device 10 of the present embodiment (including the first to third modifications) may include at least one appropriately selected from the structures of the sixth embodiment (including the first and second modifications).

The invention claimed is:

1. An optical-coupling semiconductor device, comprising:
   a primary support plate and a secondary support plate that face each other and are spaced apart a predetermined distance;
   a light emitting device situated on a surface facing the secondary support plate of the primary support plate so that a light emitting surface of the light emitting device is oriented toward the secondary support plate; and
   a light receiving device situated on a surface facing the primary support plate of the secondary support plate so that a light receiving surface of the light receiving device faces the light emitting surface so as to receive light from the light emitting surface,
   the light emitting device being on the light receiving surface of the light receiving device.

2. The optical-coupling semiconductor device according to claim 1, wherein
   the light emitting device is on the light receiving surface of the light receiving device while an optical-coupling member having light transmissive properties is interposed between the light emitting device and the light receiving surface.

3. The optical-coupling semiconductor device according to claim 2, wherein:
   the light emitting device includes a light transmissive insulating substrate which allows passage of light emitted from the light emitting device, has electrically insulating properties, and includes a surface defining the light emitting surface; and
   the optical-coupling member has electrically insulating properties and is interposed between the light transmissive insulating substrate and the light receiving surface of the light receiving device.

4. The optical-coupling semiconductor device according to claim 2, wherein
   the optical-coupling member is surrounded by a light reflective member that reflects light emitted from the light emitting device toward the light receiving device.

5. The optical-coupling semiconductor device according to claim 1, wherein
   the light emitting device is situated on the primary support plate by situating, on the primary support plate, a first interposer substrate on which the light emitting device is mounted.

6. The optical-coupling semiconductor device according to claim 5, wherein
   a difference in linear-expansivity between the first interposer substrate and the light emitting device is smaller than a difference in linear-expansivity between the primary support plate and the light emitting device.

7. The optical-coupling semiconductor device according to claim 1, wherein
   the light receiving device is situated on the secondary support plate by situating, on the secondary support plate, a second interposer substrate on which the light receiving device is mounted.

8. The optical-coupling semiconductor device according to claim 7, wherein
   a difference in linear-expansivity between the second interposer substrate and the light receiving device is smaller than a difference in linear-expansivity between the secondary support plate and the light receiving device.

9. The optical-coupling semiconductor device according to claim 1, wherein
   the primary support plate includes a mounting surface on which the light emitting element is mounted, and the primary support plate includes a light reflective member on the mounting surface of the primary support plate.

10. The optical-coupling semiconductor device according to claim 5, wherein
    the first interposer substrate includes a mounting surface on which the light emitting element is mounted, and the first interposer substrate includes a light reflective portion on the mounting surface of the first interposer substrate.

11. The optical-coupling semiconductor device according to claim 1, further comprising an encapsulating member encapsulating the light emitting device and the light receiving device,
    wherein:
       the encapsulating member includes at least one of openings in respective opposite surfaces of the encapsulating member in a direction in which the light emitting device and the light receiving device face each other; and
       one of the openings exposes an opposite surface of a portion, on which the light emitting device is situated, of the primary support plate from the light emitting device, and the other exposes an opposite surface of a portion, on which the light receiving device is situated, of the secondary support plate from the light receiving device.

12. The optical-coupling semiconductor device according to claim 11, further comprising a cover member covering a part, exposed via the corresponding opening, of the primary support plate and having a thermal emissivity higher than a thermal emissivity of the encapsulating member, and/or a cover member covering a part, exposed via the corresponding opening, of the secondary support plate and having a thermal emissivity higher than the thermal emissivity of the encapsulating member.

13. The optical-coupling semiconductor device according to claim 12, wherein
    each cover member has electrically insulating properties.

14. An optical-coupling semiconductor device, comprising:
    a primary support plate and a secondary support plate that face each other and are paced apart a predetermined distance;
    a light emitting device situated on a surface facing the secondary support plate of the primary support plate so that a light emitting surface of the light emitting device is oriented toward the secondary support plate;
    a light receiving device situated on a surface facing the primary support plate of the secondary support plate so that a light receiving surface of the light receiving device faces the light emitting surface so as to receive light from the light emitting surface;

an encapsulating member encapsulating the light emitting device and the light receiving device and holding the primary support plate and the secondary support plate;

a primary electrically conductive plate electrically connected to the light emitting device and including a part uncovered by the encapsulating member; and a secondary electrically conductive plate electrically connected to the light receiving device and including a part uncovered by the encapsulating member, a plate member, which serves as the secondary support plate, having electrically conductive properties so as to also serve as the secondary electrically conductive plate, and the primary support plate having thermally conductive properties and being separate from the primary electrically conductive plate.

15. The optical-coupling semiconductor device according to claim 14, wherein
the light emitting device is on the light receiving surface of the light receiving device.

16. The optical-coupling semiconductor device according to claim 14, further comprising a connection plate to electrically connect the primary support plate to a circuit ground of a primary circuit to be electrically connected to the light emitting device.

17. The optical-coupling semiconductor device according to claim 14, wherein:
the encapsulating member includes a first surface close to the primary support plate in a direction in which the primary support plate and the secondary support plate face each other, and includes an opening in the first surface; and an opposite surface of a portion, to which the light emitting device is attached, of the primary support plate from the light emitting device includes a face of the primary support plate exposed via the opening.

18. The optical-coupling semiconductor device according to claim 17, wherein
the encapsulating member is formed so that a vicinity of the opening of the first surface is flush with the face of the primary support plate exposed via the opening.

19. The optical-coupling semiconductor device according to claim 17, further comprising a cover member covering the face of the primary support plate exposed via the opening,
wherein the cover member has a thermal emissivity higher than a thermal emissivity of the encapsulating member.

* * * * *